(12) United States Patent
Nielsen et al.

(10) Patent No.: US 9,810,726 B2
(45) Date of Patent: Nov. 7, 2017

(54) METHOD AND SYSTEM FOR CALIBRATING PHASES OF COMB TEETH IN COMB SIGNAL WITH PILOT TONE AND USING CALIBRATED COMB TEETH PHASES TO MEASURE A DEVICE UNDER TEST

(71) Applicant: Keysight Technologies, Inc., Minneapolis, MN (US)

(72) Inventors: Troels Studsgaard Nielsen, Aalborg (DK); Felice Francesco Tafuri, Aalborg (DK)

(73) Assignee: Keysight Technologies, Inc., Santa Rosa, CA (US)

( * ) Notice: Subject to any disclaimer, the term of this patent is extended or adjusted under 35 U.S.C. 154(b) by 0 days.

(21) Appl. No.: 14/848,971

(22) Filed: Sep. 9, 2015

(65) Prior Publication Data

US 2017/0067949 A1    Mar. 9, 2017

(51) Int. Cl.
  *G01R 35/00*    (2006.01)
  *G01R 25/00*    (2006.01)
  *H03L 7/20*    (2006.01)
(52) U.S. Cl.
  CPC .......... *G01R 25/00* (2013.01); *G01R 35/007* (2013.01); *H03L 7/20* (2013.01)
(58) Field of Classification Search
  CPC ................. G01R 35/007; H03L 7/20
  USPC ....................................... 324/601
  See application file for complete search history.

(56) References Cited

U.S. PATENT DOCUMENTS

| 3,968,427 A | 7/1976 | Sharrit |
| 3,986,113 A | 10/1976 | Vifian |
| 6,018,702 A * | 1/2000 | Luiz ............ G01R 35/005 |
| | | 324/76.29 |
| 7,801,505 B2 | 9/2010 | VanWiggeren et al. |
| 8,155,904 B2 | 4/2012 | Dvorak et al. |
| 8,588,703 B2 | 11/2013 | Pickerd et al. |
| 8,849,602 B2 | 9/2014 | Nishimura et al. |
| 8,891,639 B2 | 11/2014 | Vanden Bossche |
| 9,252,895 B1 | 2/2016 | Verspecht |

(Continued)

FOREIGN PATENT DOCUMENTS

EP    2 613 460 A1    10/2013

OTHER PUBLICATIONS

Office Action dated Nov. 10, 2016 for U.S. Appl. No. 14/823,985.

(Continued)

*Primary Examiner* — Jeff Natalini

(57) ABSTRACT

A system and method sequentially measure phases of selected comb teeth of a comb signal using a local oscillator (LO) signal whose frequency and phase are changed for each sequential measurement, and adjust the measured phases to account for the change of phase in the LO signal from measurement of one selected comb tooth to the next to ascertain reference phase differences between the selected comb teeth. The measured phases of the selected comb teeth are adjusted by applying a phase offset determined from a first phase and a second phase of a pilot tone which are measured using the LO signal, respectively, before and after the frequency and phase of the LO signal change from measurement of one comb tooth to the next. The frequency of the pilot tone is maintained to be substantially the same when measuring the first phase and the second phase of the pilot tone.

20 Claims, 14 Drawing Sheets

(56) References Cited

U.S. PATENT DOCUMENTS

| | | |
|---|---|---|
| 2005/0141626 A1 | 6/2005 | Lee et al. |
| 2009/0216468 A1* | 8/2009 | Anderson .............. G01R 23/165 702/57 |
| 2012/0269252 A1 | 10/2012 | Ward |
| 2013/0154611 A1* | 6/2013 | Pate .................... G01N 21/3586 324/76.19 |
| 2014/0050259 A1 | 2/2014 | Azizi et al. |
| 2014/0269863 A1* | 9/2014 | Fan ......................... H04B 1/525 375/221 |
| 2014/0269882 A1 | 9/2014 | Thompson et al. |
| 2014/0368216 A1 | 12/2014 | Pailloncy et al. |
| 2015/0180416 A1 | 6/2015 | Fernandez |
| 2015/0312078 A1 | 10/2015 | Bogdan |

OTHER PUBLICATIONS

Mohammed El Yaagoubi et al., "Time-Domain Calibrated Measurements of Wideband Multisines Using a Large-Signal Network Analyzer," IEEE Transactions on Microwave Theory and Techniques, vol. 56, No. 5, May 2008, pp. 1180-1192.

Youngseo Ko et al., "Multi-Harmonic Broadband Measurements using an Large Signal Network Analyzer," IEEE Microwave Measurements Conference, May 28, 2010, pp. 1-6.

Peter Blockley et al., "Mixer-Based, Vector-Corrected, Vector Signal/Network Analyzer Offering 300kHz-20GHz Bandwidth and Traceable Phase Response," 2005 IEEE MTT-S International Microwave Symposium Digest, 2005, pp. 1497-1500.

Fabien De Groote et al., "Pulsed Multi-Tone Measurements for Time Domain Load Pull Characterizations of Power Transistors," IEEE Microwave Measurement Conference, 2009, pp. 1-4.

Quayle Office Action dated Jul. 14, 2016 for U.S. Appl. No. 14/824,000.

Notice of Allowance dated Sep. 20, 2016 for U.S. Appl. No. 14/824,000.

Quayle Office Action dated Jul. 15, 2016 for U.S. Appl. No. 14/981,861.

Notice of Allowance dated Sep. 12, 2016 for U.S. Appl. No. 14/981,861.

Notice of Allowance dated Mar. 10, 2017 in co-pending U.S. Appl. No. 14/824,000.

Yichi Zhang et al., "Dense Spectral Grid NVNA Phase Measurements Using Vector Signal Generators", IEEE Transaction on Intrumentation and Measurement, vol. 63, No. 12, Dec. 2014, pp. 2983-2992.

Notice of Allowance dated Jan. 5, 2017 in co-pending U.S. Appl. No. 14/981,861.

Supplemental Notice of Allowability dated Feb. 1, 2017 in co-pending U.S. Appl. No. 14/824,000.

Notice of Allowance dated Dec. 16, 2016 in co-pending U.S. Appl. No. 14/824,000.

Notice of Allowance dated Nov. 11, 2016 in co-pending U.S. Appl. No. 14/824,000.

* cited by examiner

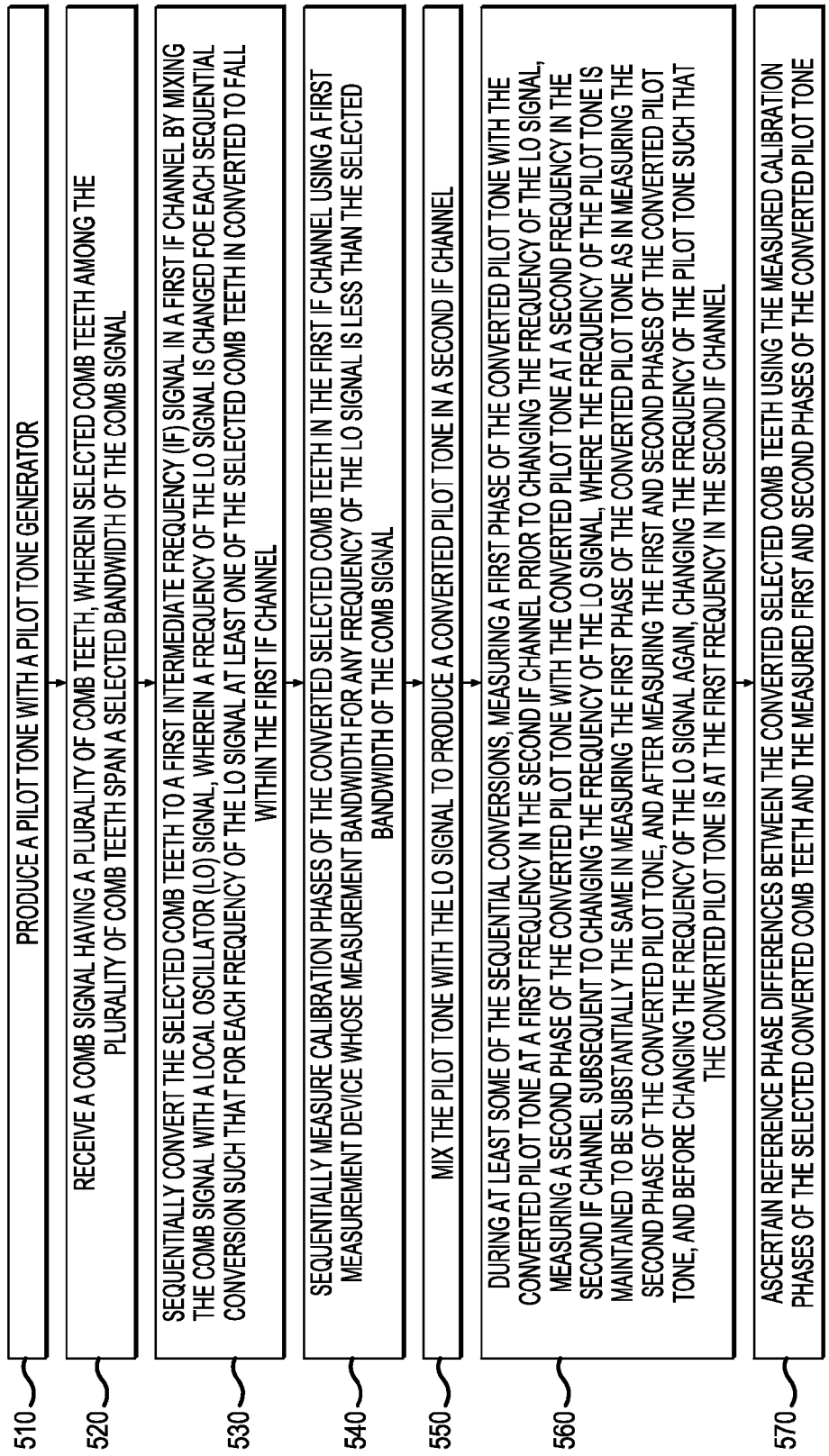

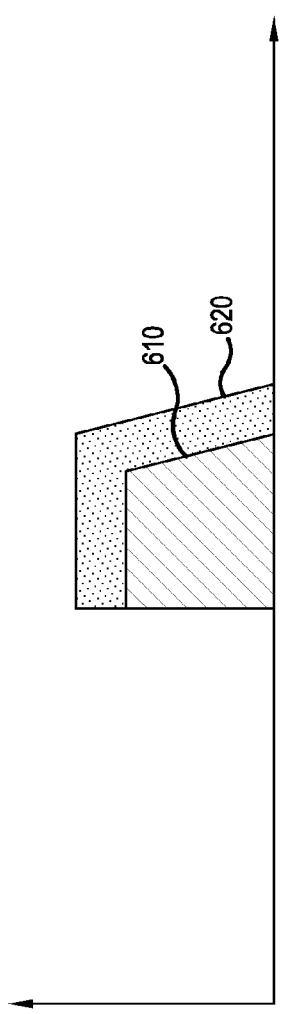

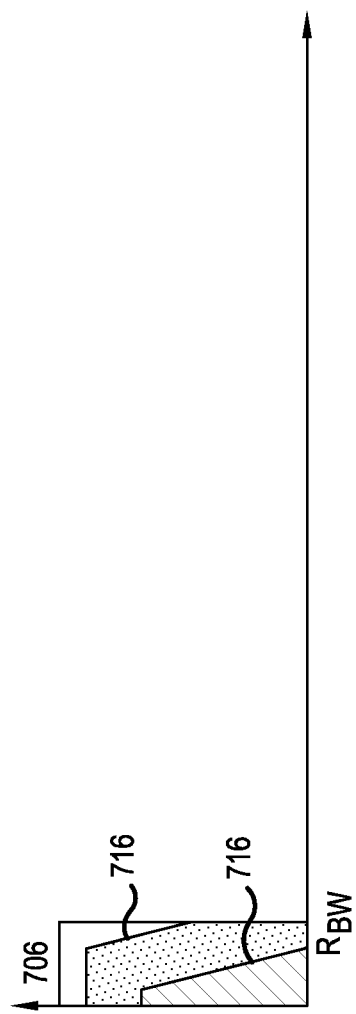

METHOD AND SYSTEM FOR CALIBRATING PHASES OF COMB TEETH IN COMB SIGNAL WITH PILOT TONE AND USING CALIBRATED COMB TEETH PHASES TO MEASURE A DEVICE UNDER TEST

BACKGROUND

A comb generator is a signal generator that produces a signal (referred to here as a comb signal) whose output spectrum consists of multiple harmonics of a fundamental frequency. The appearance of the output signal on a spectrum analyzer screen, resembling teeth of a comb, gives the device its name. In some cases, synchronous tones spanning a wide frequency bandwidth can be produced by a comb generator.

FIG. 1 illustrates an example frequency spectrum 100 of a comb signal including a plurality of tones or comb teeth 110 which are harmonically related to each other. The amplitudes of the various comb teeth 110 may be the same as each other, or different from each other as in the case illustrated in FIG. 1. Often, as shown in FIG. 1, the amplitudes of the comb teeth 110 gradually decline from the lower frequency comb teeth 110 to the higher frequency comb teeth 110.

Comb generators and comb signals find wide range of uses in RF and microwave technology. One common use is in broadband frequency synthesizers, where the high frequency comb teeth act as stable references and can be used directly, or to synchronize phase-locked loop oscillators. Comb generators and comb signals also may be used in testing of a device or system, for example to generate a complete set of substitute channels each of which carries the same baseband signal for testing a multi-channel communication system.

In some cases, a comb generator may produce a comb signal which can be used as a phase calibration standard for subsequent measurements of another unknown signal. In such cases, the comb generator may be referred to as a Harmonic Phase Reference (HPR) standard, which may be a repetitive pulse generator with an adjustable repetition rate, also called the fundamental frequency. In some cases, an HPR standard may be based on a nonlinear monolithic microwave integrated circuit (MMIC) or a step recovery diode in combination with a nonlinear transmission line. In that case, a comb signal is generated at the output of the HPR standard which has energy at every integer multiple of the input signal frequency. In general, the relative phases between the various comb teeth (e.g., comb teeth 110) may have any arbitrary values, but the phase relationship is time invariant.

In many situations, it is desired to be able to provide an accurate and complete measurement of the phase relationships between at some of the comb teeth 110 of a comb signal generated by an HPR standard using a receiver or measurement device. In some cases, it is desired to measure the phase relationships between a selected plurality of comb teeth 110 of a comb signal using a measurement device whose bandwidth is less than the total bandwidth spanned by the selected plurality of comb teeth 110.

It would also be desirable to provide a convenient and reliable method and system to measure and characterize a periodically modulated signal, and an output signal of a device under test (DUT) produced in response to the periodically modulated signal, using an HPR standard and a receiver whose bandwidth is less than the bandwidth of the periodically modulated signal itself and/or the bandwidth of the output signal. It would further be desirable to provide such a system and method which can provide accurate measurements of phase sensitive characteristics, such as the error-vector-magnitude (EVM), for a DUT.

SUMMARY

According to one aspect of the invention, a method comprises: producing a pilot tone with a pilot tone generator; receiving a comb signal having a plurality of comb teeth, wherein selected comb teeth among the plurality of comb teeth span a selected bandwidth of the comb signal; sequentially converting the selected comb teeth to a first intermediate frequency (IF) signal in a first IF channel by mixing the comb signal with a local oscillator (LO) signal, wherein a frequency of the LO signal is changed for each sequential conversion such that for each frequency of the LO signal at least one of the selected comb teeth is converted to fall within the first IF channel, and sequentially measuring calibration phase of the converted selected comb teeth in the first IF channel using a first measurement device whose measurement bandwidth for any frequency of the LO signal is less than the selected bandwidth of the comb signal; mixing the pilot tone with the LO signal to produce a converted pilot tone in a second IF channel, during at least some of the sequential conversions, measuring a first phase of the converted pilot tone with the converted pilot tone at a first frequency in the second IF channel prior to changing the frequency of the LO signal, measuring a second phase of the converted pilot tone with the converted pilot tone at a second frequency in the second IF channel subsequent to changing the frequency of the LO signal, where the frequency of the pilot tone is maintained to be substantially the same in measuring the first phase of the converted pilot tone as in measuring the second phase of the converted pilot tone, and after measuring the first and second phases of the converted pilot tone, and before changing the frequency of the LO signal again, changing the frequency of the pilot tone such that the converted pilot tone is at the first frequency in the second IF channel; and ascertaining reference phase differences between the converted selected comb teeth using the measured calibration phases of the converted selected comb teeth and the measured first and second phases of the converted pilot tone.

In some embodiments, a first IF bandwidth of the first IF channel is approximately the same as a second IF bandwidth of the second IF channel.

In some embodiments, an amount by which the frequency of the LO signal is changed for each sequential conversion is about equal to a difference between adjacent comb teeth of the comb signal.

In some embodiments, ascertaining reference phase differences between the converted selected comb teeth using the measured phases of the converted selected comb teeth and the measured first and second phases of the pilot tone comprises: for at least a current one of the sequential conversions, determining a phase adjustment as a difference between: (1) the first phase of the converted pilot tone with the converted pilot tone at the first frequency, as measured for the current sequential conversion, and (2) the second phase of the converted pilot tone with the converted pilot tone at the second frequency, as measured for an immediately preceding sequential conversion; ascertaining a measured phase difference between the measured calibration phase of the converted selected comb tooth of the current one of the sequential conversions, and the measured calibration phase of the converted selected comb tooth of a preceding one of the sequential conversions; and applying the determined phase adjustment to the measured phase difference to obtain the reference phase difference between the converted selected comb tooth of the current conversion and the converted selected comb tooth of a preceding conversion.

In some embodiments, the comb signal is received from a repetitive pulse generator.

In some embodiments, the method further comprises: receiving from a device under test (DUT) an output signal having an output signal spectrum; sequentially converting portions of the output signal spectrum down to a second intermediate frequency (IF) signal in the second IF channel by mixing the output signal with the LO signal, wherein a frequency of the LO signal is changed for each sequential conversion of the portions of the output signal spectrum, and measuring an amplitude and phase of the second IF signal as a function of frequency for each of the sequentially converted portions of the output signal spectrum using a second measurement device whose measurement bandwidth for any frequency of the LO signal is less than a bandwidth of the output signal spectrum; during at least some of the sequential conversions of the portions of the output signal spectrum, mixing the comb signal with the LO signal such that for each frequency of the LO signal at least the selected one of the comb teeth is converted to fall within the first IF channel, and sequentially measuring the phases of the converted selected comb teeth in the first IF channel using the first measurement device; adjusting the measured phase of the second IF signal as a function of frequency for one or more of the sequentially converted portions of the output signal spectrum using the measured phases of the converted selected comb teeth and the reference phase differences between the converted selected comb teeth to produce phase-adjusted measurements of the second IF signal; and stitching together the phase-adjusted measurements of the second IF signal to produce a measurement of the amplitude and phase of the output signal across the output signal spectrum as a function of frequency.

In some versions of these embodiments, adjusting the measured phase of the second IF signal as a function of frequency for one or more of the sequentially converted portions of the output signal spectrum using the measured phases of the converted selected comb teeth and the reference phase differences between the converted selected comb teeth to produce phase-adjusted measurements of the second IF signal includes: determining a measured phase difference between the measured phase of a converted selected comb tooth in the first IF channel in a current one of the conversions of the portions of the output signal spectrum and the measured phase of a converted selected comb tooth in the first IF channel in a preceding one of the conversions of the portions of the output signal spectrum; adjusting the measured comb tooth phase difference by applying a corresponding one of the reference phase differences to produce a phase adjustment for the second IF signal; and applying the phase adjustment for the second IF signal to the measured phase of the second IF signal as a function of frequency to produce a phase-adjusted measurement of the second IF signal.

In some versions of these embodiments, the method further comprises: receiving a second signal having a second signal spectrum; during each sequential conversion of the portions of the second signal spectrum, sequentially converting portions of the second signal spectrum down to a third IF signal in a third IF channel by mixing the second signal with the LO signal, and measuring an amplitude and phase of the third IF signal as a function of frequency for each of the sequentially converted portions of the second signal spectrum using a third measurement device whose measurement bandwidth for any frequency of the LO signal is less than a bandwidth of the second signal spectrum; adjusting the measured phase of the third IF signal as a function of frequency for one or more of the sequentially converted portions of the second signal spectrum using the measured phases of the converted selected comb teeth and the reference phase differences between the converted selected comb teeth to produce phase-adjusted measurements of the third IF signal; and stitching together the phase-adjusted measurements of the third IF signal to produce a measurement of the amplitude and phase of the second signal across the second signal spectrum as a function of frequency.

In some versions of these embodiments, measuring the amplitude and phase of the second IF signal as a function of frequency comprises: sampling the second IF signal at a sample rate to produce samples of the second IF signal; digitizing the samples of the second IF signal; and performing a digital Fourier transform on the digitized samples of the second IF signal.

In some versions of these embodiments, an input signal supplied to an input of the device under test in response to which the device under test generates the output signal is a periodic signal, and wherein each sample is synchronized to occur at a same point in the periodic signal for each measurement of each portion of the output signal spectrum.

According to another aspect of the invention, a system is provided, comprising: a local oscillator (LO) configured to generate an LO signal having an LO frequency; a signal generator configured to generate a pilot tone; a first frequency converter configured to receive a comb signal having a plurality of comb teeth, wherein selected comb teeth among the plurality of comb teeth span a selected bandwidth of the comb signal, and to mix the comb signal with the LO signal to produce a first intermediate frequency (IF) signal in a first IF channel; a second frequency converter configured to mix the pilot tone with the LO signal to produce converted pilot tone within a second IF channel; a first measurement device connected to an output of the first frequency converter, the first measurement device having a measurement bandwidth which for any frequency of the LO signal is less than the selected bandwidth of the comb signal; a second measurement device connected to an output of the second frequency converter; a controller configured to control the system to: sequentially convert the selected comb teeth to the first IF signal by controlling the LO to change the LO frequency for each sequential conversion, and measure a calibration phase of each of the converted selected comb teeth with the first measurement device, and during at least some of the sequential conversions: employ the second measurement device to measure a first phase of the converted pilot tone with the converted pilot tone at a first frequency in the second IF channel prior to changing the frequency of the LO signal, employ the second measurement device to measure a second phase of the converted pilot tone with the converted pilot tone at a second frequency in the second IF channel subsequent to changing the frequency of the LO signal, where the frequency of the pilot tone is maintained to be substantially the same in measuring the first phase of the converted pilot tone as in measuring the second phase of the converted pilot tone, and after measuring the first and second phases of the converted pilot tone, and before changing the frequency of the LO signal again, controlling the signal generator to change the frequency of the pilot tone such that the converted pilot tone is at the first frequency in the second IF channel, wherein the system is configured to ascertain reference phase differences between the converted selected comb teeth using the measured calibration phases of the converted selected comb teeth and the measured first and second phases of the converted pilot tone.

In some embodiments, a first IF bandwidth of the first IF channel is approximately the same as a second IF bandwidth of the second IF channel.

In some embodiments, the controller is configured to change the LO frequency for each sequential conversion is about equal to a difference between adjacent comb teeth of the comb signal.

In some embodiments, the system is configured to ascertain reference phase differences between the converted selected comb teeth using the measured phases of the converted selected comb teeth and the measured first and second phases of the pilot tone by: for at least a current one of the sequential conversions, determining a phase adjustment as a difference between: (1) the first phase of the converted pilot tone with the converted pilot tone at the first frequency, as measured for the current sequential conversion, and (2) the second phase of the converted pilot tone with the converted pilot tone at the second frequency, as measured for an immediately preceding sequential conversion; ascertaining a measured phase difference between the measured calibration phase of the converted selected comb tooth of the current one of the sequential conversions, and the measured calibration phase of the converted selected comb tooth of a preceding one of the sequential conversions; and applying the determined phase adjustment to the measured phase difference to obtain the reference phase difference between the converted selected comb tooth of the current conversion and the converted selected comb tooth of a preceding conversion.

In some embodiments, the first frequency converter comprises: a first mixer having two inputs connected respectively to an output of a repetitive pulse generator to receive the comb signal and to an output of the LO, and having an output; and a first low pass filter having an input connected to the output of the first mixer and having an output for outputting the converted selected comb teeth.

In some embodiments, the system is further configured to: receive from a device under test (DUT) an output signal having an output signal spectrum; sequentially convert portions of the output signal spectrum down to a second intermediate frequency (IF) signal in the second IF channel by mixing the output signal with the LO signal, wherein a frequency of the LO signal is changed for each sequential conversion of the portions of the output signal spectrum, and measuring an amplitude and phase of the second IF signal as a function of frequency for each of the sequentially converted portions of the output signal spectrum using a second measurement device whose measurement bandwidth for any frequency of the LO signal is less than a bandwidth of the output signal spectrum; during at least some of the sequential conversions of the portions of the output signal spectrum, mix the comb signal with the LO signal such that for each frequency of the LO signal at least the selected one of the comb teeth is converted to fall within the first IF channel, and sequentially measuring the phases of the converted selected comb teeth in the first IF channel using the first measurement device; adjust the measured phase of the second IF signal as a function of frequency for one or more of the sequentially converted portions of the output signal spectrum using the measured phases of the converted selected comb teeth and the reference phase differences between the converted selected comb teeth to produce phase-adjusted measurements of the second IF signal; and stitch together the phase-adjusted measurements of the second IF signal to produce a measurement of the amplitude and phase of the output signal across the output signal spectrum as a function of frequency.

In some versions of these embodiments, the first measurement device comprises: a sampler connected to the output of the second frequency converter and configured to sample the second IF signal to produce IF samples; an analog-to-digital converter configured to digitize the IF samples; and a digital signal processor configured to perform a digital Fourier transform on the digitized samples of the second IF signal configured to determine the amplitude and phase of the second IF signal as a function of frequency.

In some versions of these embodiments, the system further comprises: a third frequency converter configured to mix a second signal to a second IF signal in a third IF channel; and a third measurement device connected to an output of the third frequency converter and configured to measure an amplitude and phase of the second IF signal as a function of frequency for each of the sequential conversions, wherein the third measurement device has a measurement bandwidth which for any frequency of the LO signal is less than a bandwidth of the second signal spectrum, and wherein the second signal is one of: an input signal which is also supplied to an input of the device under test and in response to which the device under test generates the output signal; a reflected signal produced from the input of the device under test; and a reflected signal produced from the output of the device under test.

According to still another aspect of the invention, a method comprises: receiving a comb signal having a plurality of comb teeth, wherein selected comb teeth among the plurality of comb teeth span a selected bandwidth of the comb signal; sequentially measuring calibration phases of the selected comb teeth using a local oscillator (LO) signal whose frequency and phase are changed for each sequential measurement; and adjusting the measured calibration phases of the selected comb teeth to account for the change of phase in the LO signal from measurement of one selected comb tooth to measurement of a next selected comb tooth to ascertain reference phase differences between the selected comb teeth, wherein adjusting the measured calibration phases of the selected comb teeth to account for the change of phase in the LO signal from measurement of one selected comb tooth to measurement of the next selected comb tooth includes applying to the measured calibration phases a phase offset determined from a first phase and a second phase of a pilot tone which are measured using the LO signal, respectively, before and after the frequency and phase of the LO signal changes from measurement of one comb tooth to measurement of the next comb tooth, and wherein the frequency of the pilot tone is maintained to be substantially the same in measuring the first phase of the pilot tone as in measuring the second phase of the pilot tone.

In some embodiments, the method further comprises: receiving from a device under test (DUT) an output signal having an output signal spectrum, the output signal spectrum comprising at least two frequency ranges which together span the output signal spectrum; sequentially measuring an amplitude and a phase of the output signal as a function of frequency in each of the frequency ranges using the LO signal whose frequency and phase are changed for each sequential measurement; adjusting a measured phase of the output signal as a function of frequency for at least one of the frequency ranges to account for the change of phase in the LO signal from measurement of one frequency range to measurement of a next frequency range to produce phase-adjusted measurements of the output signal; and stitching together the phase-adjusted measurements of the output signal as a function of frequency in each of the frequency ranges to produce a measurement of the amplitude and phase of the output signal as a function of frequency across the output signal spectrum, wherein adjusting the measured phase of the output signal as a function of frequency in each of the frequency ranges includes applying to the measured phase of the output signal as a function of frequency in each of the frequency ranges includes applying a phase offset determined from phases of the converted selected comb teeth measured during each sequential measurement of the amplitude and phase of the output signal as a function of frequency in each of the frequency ranges, and the reference phase differences between the converted selected comb teeth.

BRIEF DESCRIPTION OF THE DRAWINGS

The example embodiments are best understood from the following detailed description when read with the accompanying drawing figures. In fact, the dimensions may be arbitrarily increased or decreased for clarity of discussion. Wherever applicable and practical, like reference numerals refer to like elements.

FIG. 5 illustrates a series of operations which may be performed using the measurement system of FIG. 2 in one example embodiment of a method of measuring relative phases of a selected plurality of comb teeth of a comb signal, where the bandwidth of the measurement device is less than the bandwidth of the selected plurality of comb teeth whose relative phases are to be measured.

FIGS. 6A, 6B and 6C illustrate an example of downconverting and measuring a spectrum with a measurement device having a limited bandwidth.

FIGS. 7A, 7B, 7C, 7D and 7E illustrate an example embodiment of a process of performing multiple downversions of overlapping portions of an input signal and output signal spectrum to measure the input and output signal with a measurement device having a limited bandwidth.

DETAILED DESCRIPTION

In the following detailed description, for purposes of explanation and not limitation, example embodiments disclosing specific details are set forth in order to provide a thorough understanding of an embodiment according to the present teachings. However, it will be apparent to one having ordinary skill in the art having had the benefit of the present disclosure that other embodiments according to the present teachings that depart from the specific details disclosed herein remain within the scope of the appended claims. Moreover, descriptions of well-known apparati and methods may be omitted so as to not obscure the description of the example embodiments. Such methods and apparati are clearly within the scope of the present teachings.

Unless otherwise noted, when a first device is said to be connected to a second device, this encompasses cases where one or more intermediate devices may be employed to connect the two devices to each other. However, when a first device is said to be directly connected to a second device, this encompasses only cases where the two devices are connected to each other without any intermediate or intervening devices. Similarly, when a signal is said to be coupled to a device, this encompasses cases where one or more intermediate devices may be employed to couple the signal to the device. However, when a signal is said to be directly coupled to a device, this encompasses only cases where the signal is directly coupled to the device without any intermediate or intervening devices.

Figure 2:
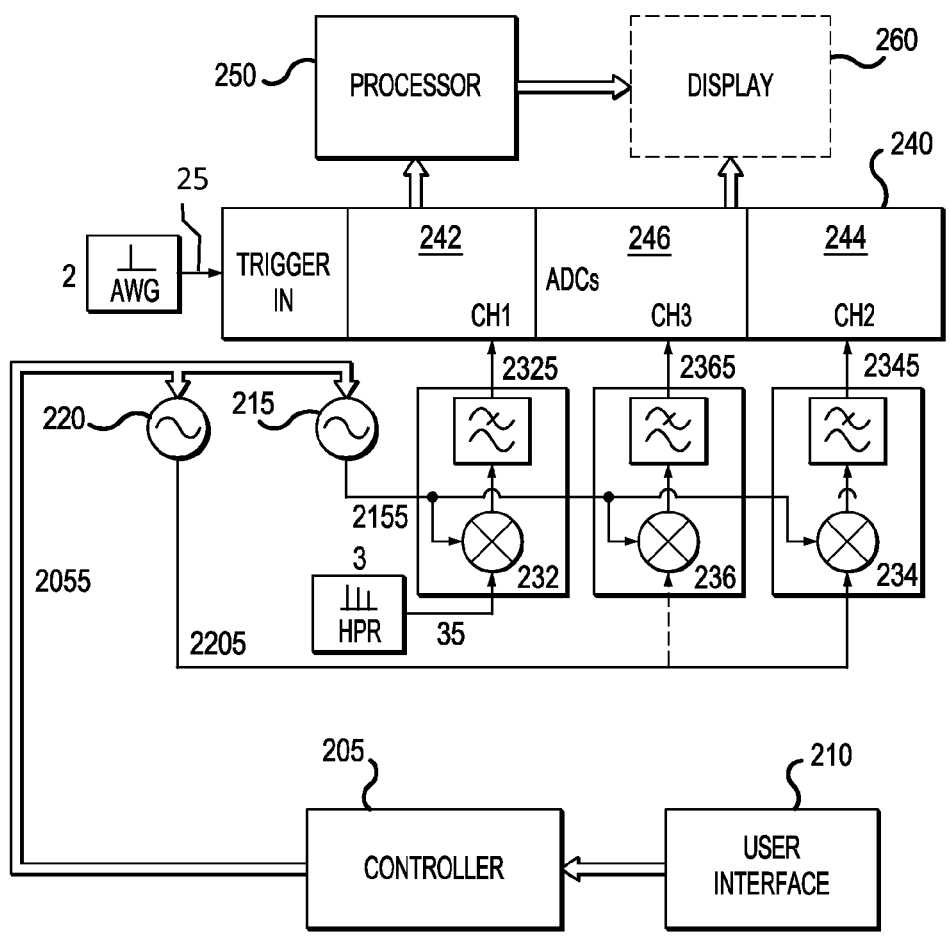
FIG. 2 illustrates an example embodiment of a measurement system for measuring relative phases of a selected plurality of comb teeth of a comb signal, where the bandwidth of a measurement device of the measurement system is less than the total bandwidth of the selected plurality of comb teeth whose relative phases are to be measured.

FIG. 2 illustrates an example embodiment of a measurement system 200 for measuring relative phase relationships among a selected plurality of comb teeth of a comb signal, where the bandwidth of a measurement device in measurement system 200 is less than the total bandwidth spanning the selected plurality of comb teeth whose phase relationships are to be measured. Measurement system 200 includes: a controller 205; a user interface 210; a local oscillator 215; a signal generator 220 (also referred to as a pilot tone generator); a first frequency converter 232 (also referred to as a reference frequency converter); a second frequency converter 234 (also referred to as a pilot frequency converter); optionally a third frequency converter 236; a measurement instrument 240; a processor 250; and a display 260.

Controller 205 may include one or more processing elements (e.g., CPUs), memory (including volatile and/or nonvolatile memory), and a communication interface for communicating with local oscillator 215 and signal generator 220. The memory may store therein instructions for causing the processor(s) to control operations of system 200, for example to perform various operations and methods described herein such as with respect to FIGS. 3-5 below. In some embodiments, controller 205 may communicate commands to local oscillator 215 and signal generator 220 to set or adjust their output frequencies, amplitudes, etc. via a communication connection or bus 2055. Such communications may employ any of a variety of standard protocols such as General Purpose Interface Bus (GPIB)/IEEE-488, LAN eXtensions for Instrumentation (LXI), VME eXtensions for Instrumentation (VXI), PCI eXtensions for Instrumentation (PXI), universal serial bus (USB), FireWire, Ethernet, TCP/IP, etc.

In some embodiments, user interface 210 allows a user to program and/or set operating parameters for controller 205. For example, where controller 205 executes an algorithm which controls the output frequencies of local oscillator 215 and signal generator 220, in some embodiments a user may enter the frequencies via user interface 210. User interface 210 may include any combination of well known input devices and output devices, such as a keyboard, mouse, trackball, keypad, pushbuttons, one or more display devices (which may include LCD readouts), etc.

In some embodiments, controller 205 and user interface 210 may be integrated into a single device, such as a computer, laptop, tablet, smartphone, etc.

Local oscillator 215 and signal generator 220 may each comprise a programmable frequency generator generating a signal whose frequency is programmable, for example under control of controller 205 and/or via input controls integrated into the device.

Local oscillator 215 generates or produces a local oscillator (LO) signal 2155, and signal generator 220 generates or produces a pilot tone 2205.

First frequency converter 232, second frequency converter 234, and third frequency converter 236 each include a mixer and a low pass filter (LPF). Each of the mixers has two inputs, including a first input which receives LO signal 2155, and an output. The output of each mixer is connected to an input of the corresponding LPF, and the output of each LPF is at the output of the corresponding frequency converter. Beneficially, the bandwidths of the LPFs in first frequency converter 232, second frequency converter 234, and third frequency converter 236 may all be the same, or approximately the same, as each other.

First frequency converter 232 is also configured, or connected, to receive an output signal, in particular a comb signal 35, of a repetitive pulse generator which may be employed as a Harmonic Phase Reference (HPR) standard 3. More specifically, comb signal 35 is provided to the second input of the mixer of first frequency converter 232 and the mixer is configured to mix comb signal 35 with LO signal 2155 to produce an intermediate frequency (IF) signal, also referred to herein as first IF signal, in a first IF channel 2325 (also referred to as a reference channel) at the output of the mixer. The input of the LPF receives the first IF signal, and the output of the LPF outputs the first IF signal at the output of first frequency converter 232.

Optionally, in place of or in addition to being provided to the second input of the mixer of first frequency converter 232, comb signal 35 may be provided to the second input of the mixer of third frequency converter 236. In that case, the mixer of third frequency converter 236 is configured to mix comb signal 35 with LO signal 2155 to produce a third IF signal in a third IF channel 2365 at the output of the mixer. The input of the LPF receives the third IF signal, and the output of the LPF outputs the third IF signal at the output of third frequency converter 236.

Meanwhile, second frequency converter 234 is configured, or connected, to receive pilot tone 2205 from signal generator 220. More specifically, pilot tone 2205 is provided to the second input of the mixer of second frequency converter 234 and the mixer is configured to mix pilot tone 2205 with LO signal 2155 to produce a converted pilot tone in a second IF channel 2345 at the output of the mixer. The input of the LPF receives the converted pilot tone, and the output of the LPF outputs the converted pilot tone at the output of second frequency converter 234.

Measurement instrument 240 includes a first measurement device 242 (also referred to as a reference measurement device), a second measurement device 244, and optionally a third measurement device 246.

First measurement device 242, second measurement device 244, and third measurement device 246 may each comprise a sampler, an analog-to-digital converter (ADC) and memory. In some embodiments, memory may be shared among first measurement device 242, second measurement device 244, and third measurement device 246. In particular first measurement device 242 is configured to sample and digitize first IF channel 2325 and produce a plurality of data samples at an operating frequency of the sampler and ADC. Second measurement device 244 is configured to sample and digitize second IF channel 2345 and produce a plurality of data samples at an operating frequency of the sampler and ADC. Third measurement device 246 is configured to sample and digitize third IF channel 2365 and produce a plurality of data samples at an operating frequency of the sampler and ADC. The data samples may be stored in memory for subsequent processing by measurement instrument 240 and/or processor 250. Beneficially, the operating frequencies of all of the samplers/ADCs, and the bandwidths of first measurement device 242, second measurement device 244, and third measurement device 246 may all be the same as each other. Beneficially, the bandwidths of the LPFs in first frequency converter 232, second frequency converter 234, and third frequency converter 236 may be selected to match the operating bandwidths of the ADCs in first measurement device 242, second measurement device 244, and third measurement device 246. In some embodiments, first measurement device 242, second measurement device 244, and third measurement device 246 each may include a digital signal processor which is configured to perform a Fourier transform (e.g., a digital Fourier transform) on data samples output by the ADC.

Processor 250 may include one or more processing elements (e.g., CPUs) and memory, including volatile and/or nonvolatile memory, which may store instructions to be executed by the processing element(s). Processor 250 is configured to process the data samples from first measurement device 242, second measurement device 244, and third measurement device 246 to provide measurements of comb signal 35 and the second signal (e.g., input signal 55) provided to third measurement device 246. In some embodiments, processor 250 may include one or more digital signal processors configured to perform a Fourier transform (e.g., a digital Fourier transform) on data samples from each of the first measurement device 242, second measurement device 244, and third measurement device 246.

In some embodiments, processor 250 and controller 205 may be combined, and may share processing resources, including memory, one or more processors, and/or user interface 210.

Display 260 is configured to display waveforms generated by processor 250 from ADC data produced by measurement instrument 240. In some embodiments, display 260 may be combined with, or part of, user interface 210.

Figure 1:
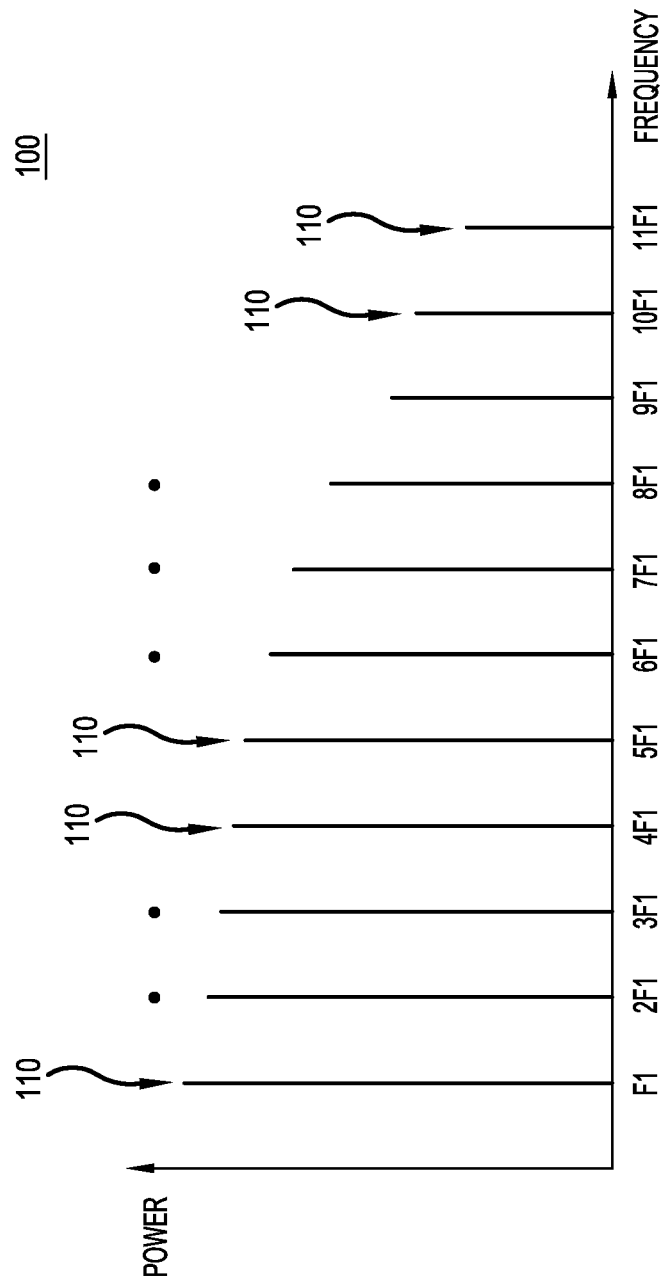
FIG. 1 illustrates an example frequency spectrum of a comb signal.

Operations of system 200 for measuring phase relationships between or among a plurality of comb teeth (e.g., comb teeth 110—see FIG. 1) of comb signal 35 will now be described.

Here it is assumed that a selected bandwidth $S_{BW}$ of comb signal 35 which spans a selected plurality of comb teeth 110 whose phase relationships are to be measured is greater than the receiver bandwidth $R_{BW}$ of first measurement device 242, which may be limited by the maximum conversion rate of an ADC which is included in first measurement device 242. Furthermore, it is assumed here that local oscillator 215 and signal generator 220 are frequency locked or synchronized to a common master reference frequency (e.g., 10 MHz), for example provided by a master reference frequency generator (not shown in FIG. 2) to which all of these components are connected. Finally, it is assumed that any systematic phase dispersions in IF channels 2325/2345/2365 are corrected for by system 200, for example by means of a system calibration procedure.

In order to measure the phase relationships of the selected plurality of comb teeth 110 of comb signal 35 spanning the selected bandwidth $S_{BW}$ which is wider than the receiver bandwidth $R_{BW}$ of first measurement device 242, the spectrum of comb signal 35 spanning the selected bandwidth $S_{BW}$ will be divided into two or more overlapping portions or frequency ranges which are each individually or sequentially measured.

However, every one of these measurements of the phases of comb teeth 110 in a different portion of the spectrum of comb signal 35 will be made with a different LO frequency, and in general when the LO frequency is changed, an arbitrary and unknown phase shift occurs in LO signal 2155. Thus the measured phase differences between comb teeth 110 in the different portions of the spectrum of comb signal 35 which are measured separately must be adjusted or corrected to factor out these phase shifts in LO signal 2155. It should be noted that the same LO signal 2155 is used by the first, second and third frequency converters 232, 234 and 236.

System 200 addresses this challenge by measuring the phase shifts of LO signal 2155 when the LO frequency is changed from one measurement to the next through the use of second frequency converter 234, second measurement device 244, and pilot tone 2205 generated by signal generator 220. In particular, system 200 (e.g., by means of processor 250) adjusts the measured phases of comb teeth 110 in first IF channel 2325 for one or more of the sequentially converted portions of the spectrum of comb signal 35 by applying to the measured phases of comb teeth 110 a phase offset determined from measured phases of the converted pilot tone 2205 to account for the change of phase in LO signal 2155 from measurement of one portion (or frequency range) to measurement of a next portion (or frequency range), to thereby produce reference phase differences between the converted selected comb teeth 110.

In operation, comb signal 35 is converted to a first IF signal at a lower frequency in first IF channel 2325 by first frequency converter 232. In particular, first frequency converter 232 mixes comb signal 35 with LO signal 2155, and then low pass filters the output of the mixer. The first IF signal in first IF channel 2325 is then sampled and digitized by a corresponding ADC in first measurement device 242 to produce ADC data. Processor 250 converts the ADC data to frequency domain data by performing a digital Fourier transform (DFT) on the ADC data.

Meanwhile, second frequency converter 234 mixes pilot tone 2205 mixed with LO signal 2155, and then low pass filters the output of the mixer, to produce a converted pilot tone in second IF channel 2345. The converted pilot tone in second IF channel 2345 is then sampled and digitized by a corresponding ADC in second measurement device 244 to produce ADC data. Processor 250 converts the ADC data to frequency domain data by performing a digital Fourier transform (DFT) on the ADC data.

The ADCs in first, second, and third measurement devices 242, 244 and 246 are synchronized with each other, for example by using a trigger signal 25 output by an arbitrary waveform generator (AWG) generator 2 and provided to measurement instrument 240, which uses it as a trigger signal for the ADCs. Other methods can be used to realize the synchronization. Beneficially, each sample made by the samplers and ADCs may be synchronized to occur at a same point in the fundamental period of comb signal 35.

A concrete example will now be provided to better illustrate various aspects of embodiments of the systems and methods disclosed herein. In this example, the selected bandwidth $S_{BW}$ of the frequency spectrum of the comb signal 35 for which phase relationships between a selected plurality of comb teeth 110 are being measured is divided into N=4 portions in which the phases of the comb teeth 110 are measured separately or sequentially. However it should be understood that in general N may be any integer greater than 1.

Figure 3:
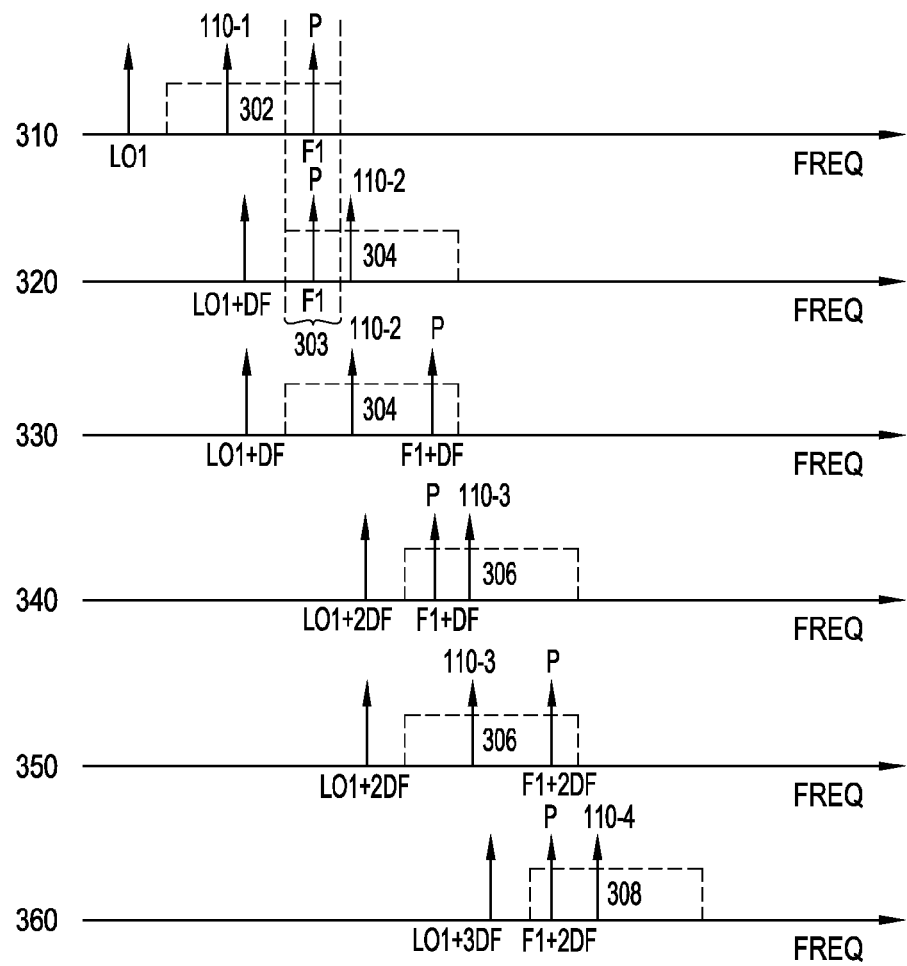
FIG. 3 illustrates an example embodiment of a method of measuring relative phases of a selected plurality of comb teeth of a comb signal, where the bandwidth of the measurement device which is employed is less than the total bandwidth of the selected plurality of comb teeth whose relative phases are to be measured.

FIG. 3 illustrates an example embodiment of a method 300 of measuring relative phases of a selected plurality of comb teeth 110 of a comb signal (e.g., comb signal 35), where the bandwidth of the measurement device which is employed is less than the total bandwidth of the selected plurality of comb teeth 110 whose relative phases are to be measured. When comb signal 35 is to be subsequently used for measuring one or more characteristics of one or more unknown signals, the method 300 may be considered to comprise a calibration process for the comb signal 35 and HPR standard 3.

For simplicity of illustration and explanation, it is here assumed that comb signal 35 includes only one comb tooth 110 (see FIG. 1) in each portion of its spectrum which is separately or sequentially processed by the measurement device (e.g., first measurement device 242). For example, an input of HPR standard 3 may be driven by a sinusoidal signal with a frequency which is equal or about equal to the bandwidth of first measurement device 242. However, in general it should be understood that two or more comb teeth 110 may be included in each portion of the spectrum of comb signal 35 which is separately or sequentially processed, and the phase of one or more of those comb teeth 110 in each portion of the spectrum of comb signal 35 may be measured.

In an operation 310, the LO frequency of LO signal 2155 is set (e.g., by controller 205) to LO1 for converting first comb tooth 110-1 to a first IF signal in first IF channel 2325. The frequency of pilot tone 2205 (also referred to as P) is set (e.g., by controller 205) to a frequency F1 such that the downconverted pilot tone 2205 appears in the upper part of second IF channel 2345 (which mirrors first IF channel 2325), in particular a region (e.g., overlap region 303) of the first portion of the spectrum which overlaps with a second portion of the spectrum (e.g., second portion 304) to be measured next. Measurement instrument 240 measures the first IF signal in first IF channel 2325 and the downconverted pilot tone 2205 in second IF channel 2345. Measurement instrument 240 or processor 250 obtains a phase (here referred to as a calibration phase) (PHC1) of the converted first comb tooth 110-1, and a first phase (P1) of the downconverted pilot tone 2205, which may be stored in memory.

Next, in an operation 320, the LO frequency of LO signal 2155 is set (e.g., by controller 205) to LO2=LO1+DF. Here, DF may be selected to be about equal to a difference between adjacent comb teeth of the comb signal. The frequency of pilot tone 2205 is maintained to be substantially the same as in the immediately preceding conversion or operation 310. Here, when we say that the frequency of pilot tone 2205 is maintained to be substantially the same as in an immediately preceding conversion, this indicates that the frequency remains the same except for any minor frequency drift within the tolerances of signal generator 220. For example, controller 205 may not issue any command in operation 320 to signal generator 220 to change the frequency of pilot tone 2205, and accordingly signal generator 220 continues to output pilot tone 2205 whose frequency is not changed with respect to immediately preceding operation 310. As explained below, by maintaining the frequency of pilot tone 2205 unchanged between operations 310 and 320, a reference point can be established for factoring out an effect caused by a change in the phase of LO signal 2155 which occurs in general between operations 310 and 320 due to the output frequency of local oscillator 215 being changed or reprogrammed, for example by controller 205.

Because the frequency of LO signal 2155 is changed in operation 320 while the frequency of pilot tone 2205 remains substantially unchanged, downconverted pilot tone 2205 now appears in the lower part of second IF channel 2345 (which, again, mirrors first IF channel 2325), in particular it appears in overlap region 303 which overlaps with the first portion 302 of the spectrum which was measured in operation 310. Measurement instrument 240 measures the first IF signal in first IF channel 2325 representing the downconverted second portion of comb signal 35 including second comb tooth 110-2, and the downconverted pilot tone 2205 in second IF channel 2345. Measurement instrument 240 or processor 250 obtains a calibration phase (PHC2) of the converted second comb tooth 110-2, and a second phase (P2) of the downconverted pilot tone 2205, which may be stored in memory.

Measurement instrument 240 or processor 250 calculates a phase correction or fixed phase shift, T1, which may be stored in memory. Here, T1=P1−P2. Measurement instrument 240 or processor 250 ascertains or calculates a first reference phase difference R1 between the converted first and second comb teeth 110-1 and 110-2 using the measured calibration phases PHC1 and PHC2 of first and second comb teeth 110-1 and 110-2 and the phase correction T1 produced from the measured first and second phases P1 and P2 of the converted pilot tone P. In particular, first reference phase difference R1 may be determined as: R1=PHC1−PHC2+T1. R1 may be stored in memory.

Next, in an operation 330, the frequency of pilot tone 2205 is adjusted or changed (e.g., by controller 205) to a frequency F1+DF such that the downconverted pilot tone 2205 now appears again in the upper part of second IF channel 2345, in particular a region of the second portion 304 of the spectrum which overlaps with a third portion 306 of the spectrum to be measured next. Measurement instrument 240 measures the downconverted pilot tone 2205 in second IF channel 2345, and measurement instrument 240 or processor 250 obtains the phase (P3) of the downconverted pilot tone 2205. The value of P3 may be stored in memory.

Next, in an operation 340, the LO frequency of LO signal 2155 is set (e.g., by controller 205) to LO3=LO1+2DF. The frequency of pilot tone 2205 is maintained to be substantially the same as in the immediately preceding conversion or operation 330. Because the frequency of LO signal 2155 is changed in operation 340 while the frequency of pilot tone 2205 remains substantially unchanged, downconverted pilot tone 2205 now appears again in the lower part of second IF channel 2345, in particular a region of the third portion 306 of the spectrum which overlaps with the second portion 304 of the spectrum which was measured in operation 320. Measurement instrument 240 measures the first IF signal in first IF channel 2325 representing the downconverted third portion of comb signal 35 including third comb tooth 110-3, and the downconverted pilot tone 2205 in second IF channel 2345. Measurement instrument 240 or processor 250 obtains a calibration phase (PHC3) of the converted third comb tooth 110-3, and a fourth phase (P4) of the downconverted pilot tone 2205, which may be stored in memory.

Measurement instrument 240 or processor 250 calculates a phase correction or fixed phase shift, T2, which may be stored in memory. Here, T2=P3−P4. Measurement instrument 240 or processor 250 ascertains or calculates a second reference phase difference R2 between the converted second and third comb teeth 110-2 and 110-3 using the measured calibration phases PHC2 and PHC3 of second and third comb teeth 110-2 and 110-3 and the phase correction T2 produced from the measured third and fourth phases P3 and P4 of the converted pilot tone P. In particular, second reference phase difference R2 may be determined as: R2=PHC2−PHC3+T2. R2 may be stored in memory.

Next, in an operation 350, the frequency of pilot tone 2205 is adjusted or changed (e.g., by controller 205) to a frequency F1+2DF such that the downconverted pilot tone 2205 now appears again in the upper part of second IF channel 2345, in particular a region of the third portion 306 of the spectrum which overlaps with a fourth portion 308 of the spectrum to be measured next. Measurement instrument 240 measures the downconverted pilot tone 2205 in second IF channel 2345, and measurement instrument 240 or processor 250 obtains the amplitude and phase (P5) of the downconverted pilot tone 2205. The value of P5 may be stored in memory.

Next, in an operation 360, the LO frequency of LO signal 2155 is set (e.g., by controller 205) to LO3=LO1+3DF. The frequency of pilot tone 2205 is maintained to be substantially the same as in the immediately preceding conversion or operation 350. Because the frequency of LO signal 2155 is changed in operation 360 while the frequency of pilot tone 2205 remains substantially unchanged, downconverted pilot tone 2205 now appears again in the lower part of second IF channel 2345, in particular a region of the fourth portion 308 of the spectrum which overlaps with the third portion 306 of the spectrum which was measured in operation 340. Measurement instrument 240 measures the first IF signal in first IF channel 2325 representing the downconverted fourth portion of comb signal 35 including fourth comb tooth 110-4, and the downconverted pilot tone 2205 in second IF channel 2345. Measurement instrument 240 or processor 250 obtains a calibration phase (PHC4) of the converted fourth comb tooth 110-3, and a sixth phase (P6) of the downconverted pilot tone 2205, which may be stored in memory.

Measurement instrument 240 or processor 250 calculates a phase correction or fixed phase shift, T3, which may be stored in memory. Here, T3=P4−P6. Measurement instrument 240 or processor 250 ascertains or calculates a third reference phase difference R3 between the converted third and fourth comb teeth 110-3 and 110-4 using the measured calibration phases PHC3 and PHC4 of third and fourth comb teeth 110-3 and 110-4 and the phase correction T3 produced from the measured fifth and sixth phases P5 and P6 of the converted pilot tone P. In particular, third reference phase difference R3 may be determined as: R3=PHC3−PHC4+T3. R3 may be stored in memory.

In general, this procedure is repeated until all N portions of the spectra of comb signal 35 are measured with together span the selected bandwidth $S_{BW}$ of the selected comb teeth 110 of the comb signal.

Figure 4A:
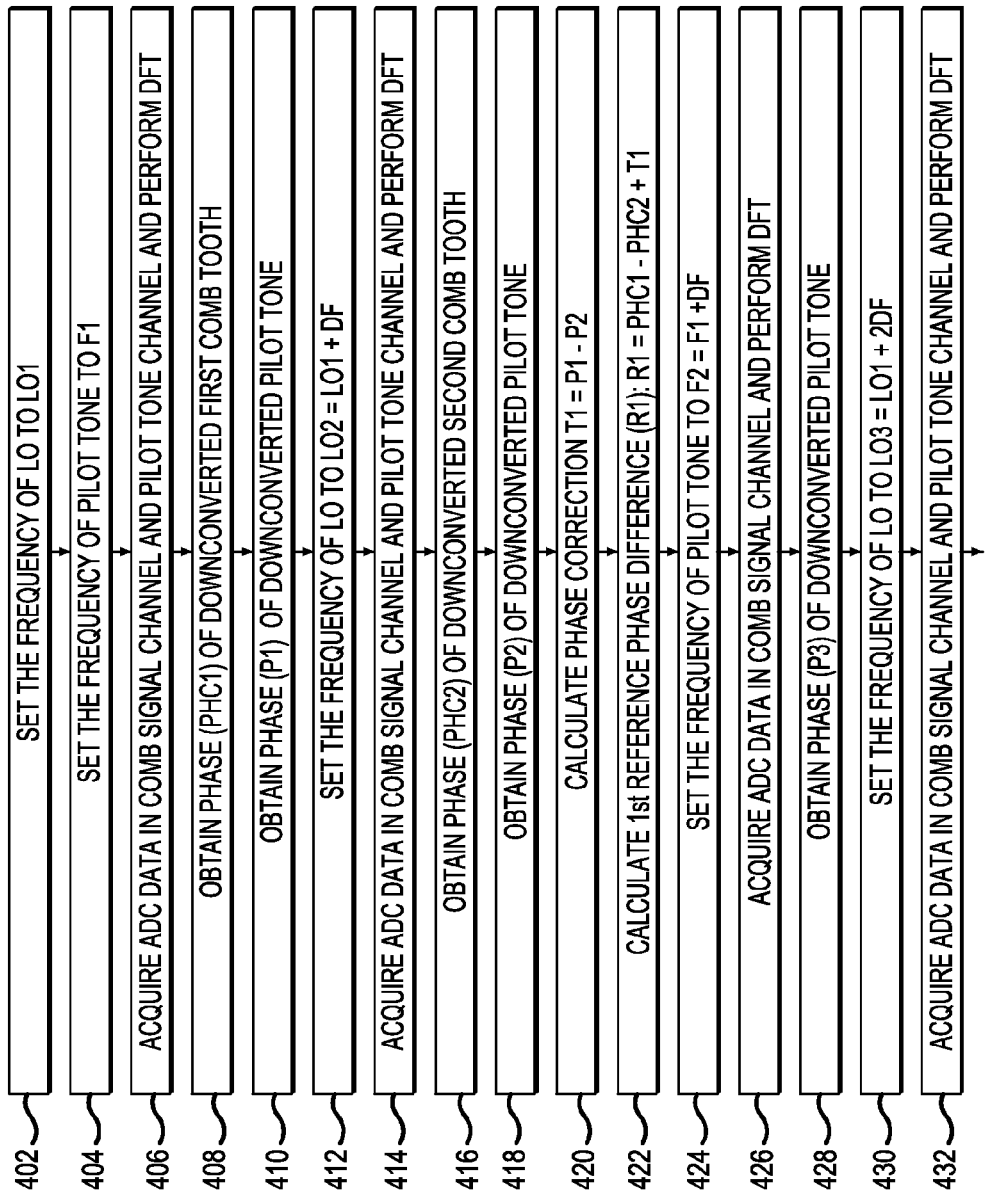
FIGS. 4A and 4B show a flowchart of a method of measuring relative phases of a selected plurality of comb teeth of a comb signal, where the bandwidth of the measurement device is less than the total bandwidth of the selected plurality of comb teeth whose relative phases are to be measured.
Figure 4B:
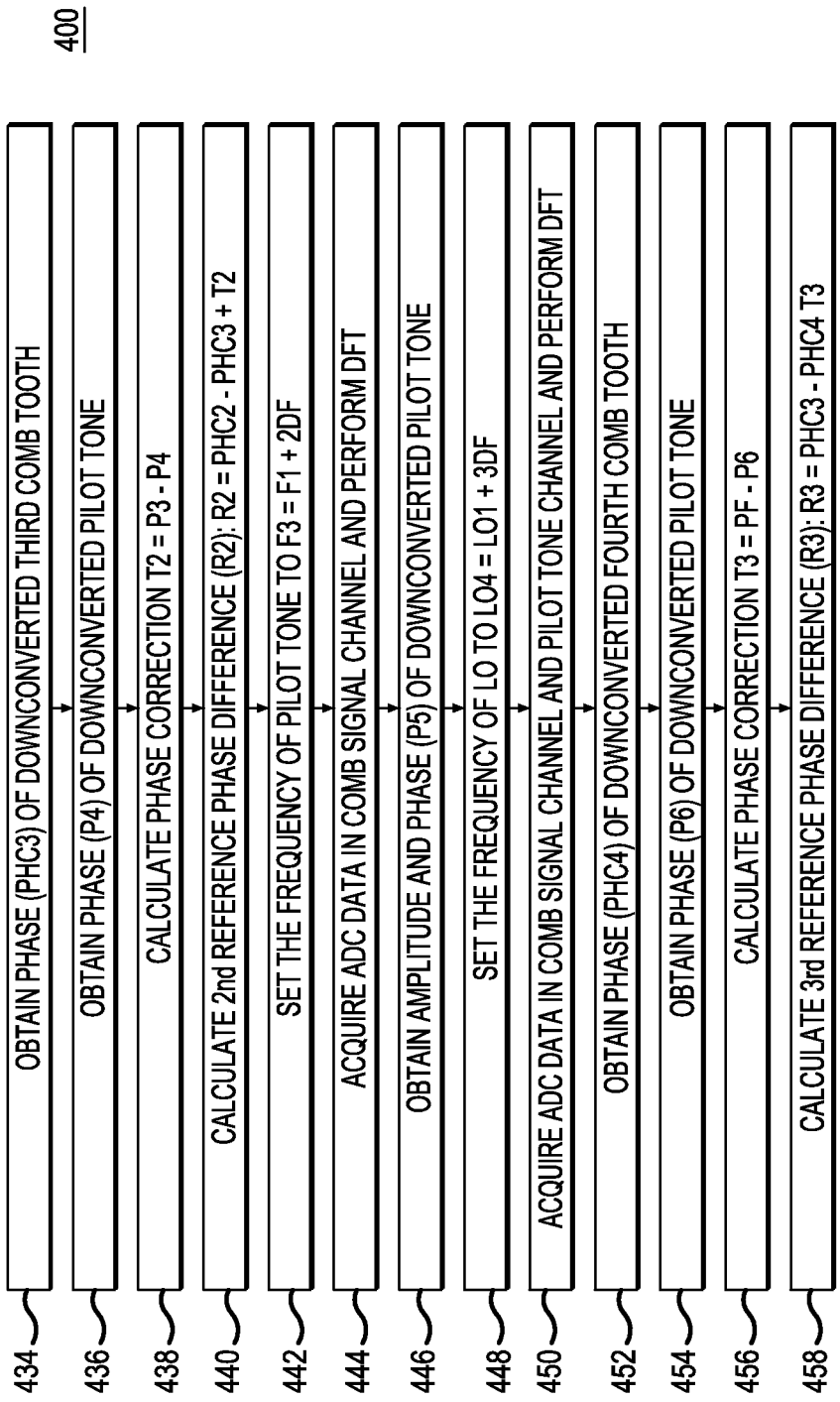

FIGS. 4A and 4B show a flowchart of a method of measuring relative phases of a selected plurality of comb teeth of a comb signal, where the bandwidth of the measurement device is less than the total bandwidth of the selected plurality of comb teeth whose relative phases are to be measured. In particular, the method 400 comprises an embodiment of detailed steps for the method 300 shown in FIG. 3.

An operation 402 includes setting the frequency of LO signal 2155 to LO1. In some embodiments, this operation may be performed by controller 205 sending a command to local oscillator 215 via communication bus 2055.

An operation 404 includes setting the frequency of pilot tone 2205 to F1. In some embodiments, this operation may be performed by controller 205 sending a command to signal generator 220 via communication bus 2055.

An operation 406 includes acquiring ADC data for the IF channels for comb signal 35 and pilot tone 2205, and performing a digital Fourier transform (DFT) on the ADC data. For example, the ADC data for comb signal 35 may be obtained by first measurement device 242 sampling the first IF signal in first IF channel 2325 at a sample rate, and digitizing the sample. In various embodiments, measurement instrument 240 or processor 250 may perform the digital Fourier transform on the digitized samples of the first IF signal (also referred to as digitized IF samples).

An operation 408 includes obtaining the phase (here referred to as the calibration phase) of the downconverted first comb tooth 110-1. In various embodiments, operation 408 may be performed by measurement instrument 240 and/or processor 250.

An operation 410 includes obtaining a first phase of the downconverted pilot tone 2205 with pilot tone 2205 at frequency F1. In some embodiments, operation 410 may be performed by measurement instrument 240 and/or processor 250.

An operation 412 includes setting the frequency of LO signal 2155 to LO2=LO1+DF. In some embodiments, this operation may be performed by controller 205 sending a command to local oscillator 215 via communication bus 2055.

An operation 414 includes acquiring ADC data for the IF channels for comb signal 35 and pilot tone 2205, and performing a digital Fourier transform (DFT) on the ADC data, as in operation 406 described above.

An operation 416 includes obtaining the calibration phase of the downconverted second comb tooth 110-2. In various embodiments, operation 416 may be performed by measurement instrument 240 and/or processor 250.

An operation 418 includes obtaining a second phase of the downconverted pilot tone 2205 with pilot tone 2205 at frequency F1. In some embodiments, operation 418 may be performed by measurement instrument 240 and/or processor 250.

An operation 420 includes calculating a phase correction T1=measured first phase of the downconverted pilot tone 2205 in operation 410−measured second phase of the downconverted pilot tone 2205 in operation 418. In some embodiments, operation 420 may be performed by measurement instrument 240 and/or processor 250.

An operation 422 includes ascertaining or calculating a first reference phase difference R1 by subtracting the calibration phase of the downconverted second comb tooth 110-2 from the calibration phase of the downconverted first comb tooth 110-1, and adding the phase correction T1.

An operation 424 includes setting the frequency of pilot tone 2205 to F2=F1+DF. In some embodiments, this operation may be performed by controller 205 sending a command to signal generator 220 via communication bus 2055.

An operation 426 includes acquiring ADC data for the downconverted pilot tone 2205 in second IF channel 2345, and performing a discrete Fourier transform (e.g., a digital Fourier transform). For example, the ADC data for second IF channel 2345 may be obtained by second measurement device 244 sampling second IF channel 2345 at a sample rate, and digitizing the sample. In some embodiments, measurement instrument 240 or processor 250 performs a digital Fourier transform on the digitized samples of the downconverted pilot tone 2205.

An operation 428 includes obtaining a third phase of the downconverted pilot tone 2205 with pilot tone 2205 at frequency F2. In some embodiments, operation 430 may be performed by measurement instrument 240 and/or processor 250.

An operation 430 includes setting the frequency of LO signal 2155 to LO2=LO1+2DF. In some embodiments, this operation may be performed by controller 205 sending a command to local oscillator 215 via communication bus 2055.

An operation 432 includes acquiring ADC data for the IF channels for comb signal 35 and pilot tone 2205, and performing a digital Fourier transform (DFT) on the ADC data, as in operation 406 described above.

An operation 434 includes obtaining the calibration phase of the downconverted third comb tooth 110-3. In various embodiments, operation 434 may be performed by measurement instrument 240 and/or processor 250.

An operation 436 obtaining a fourth phase of the downconverted pilot tone 2205 with pilot tone 2205 at frequency F2. In some embodiments, operation 436 may be performed by measurement instrument 240 and/or processor 250.

An operation 438 includes calculating a phase correction T2=measured third phase of the downconverted pilot tone 2205 in operation 428−measured fourth phase of the downconverted pilot tone 2205 in operation 436. In some embodiments, operation 438 may be performed by measurement instrument 240 and/or processor 250.

An operation 440 includes ascertaining or calculating a second reference phase difference R2 by subtracting the calibration phase of the downconverted third comb tooth 110-3 from the calibration phase of the downconverted second comb tooth 110-2, and adding the phase correction T2.

An operation 442 includes setting the frequency of pilot tone 2205 to F3=F1+2DF. In some embodiments, this operation may be performed by controller 205 sending a command to signal generator 220 via communication bus 2055.

An operation 444 includes acquiring ADC data for the downconverted pilot tone 2205 in second IF channel 2345, and performing a discrete Fourier transform (e.g., a digital Fourier transform). For example, the ADC data for second IF channel 2345 may be obtained by second measurement device 244 sampling second IF channel 2345 at a sample rate, and digitizing the sample. In some embodiments, measurement instrument 240 or processor 250 performs a digital Fourier transform on the digitized samples of the downconverted pilot tone 2205.

An operation 446 includes obtaining a fifth phase of the downconverted pilot tone 2205 with pilot tone 2205 at frequency F3. In some embodiments, operation 448 may be performed by measurement instrument 240 and/or processor 250.

An operation 448 includes setting the frequency of LO signal 2155 to LO2=LO1+3DF. In some embodiments, this operation may be performed by controller 205 sending a command to local oscillator 215 via communication bus 2055.

An operation 450 includes acquiring ADC data for the IF channels for comb signal 35 and pilot tone 2205, and performing a digital Fourier transform (DFT) on the ADC data, as in operation 406 described above.

An operation 452 includes obtaining the calibration phase of the downconverted fourth comb tooth 110-4. In various embodiments, operation 452 may be performed by measurement instrument 240 and/or processor 250.

An operation 454 includes obtaining a sixth phase of the downconverted pilot tone 2205 with pilot tone 2205 at frequency F3. In some embodiments, operation 454 may be performed by measurement instrument 240 and/or processor 250.

An operation 456 includes calculating a phase correction T3=measured fifth phase of the downconverted pilot tone 2205 in operation 446−measured sixth phase of the downconverted pilot tone 2205 in operation 454. In some embodiments, operation 456 may be performed by measurement instrument 240 and/or processor 250.

An operation 458 includes ascertaining or calculating a third reference phase difference R3 by subtracting the calibration phase of the downconverted fourth comb tooth 110-4 from the calibration phase of the downconverted third comb tooth 110-3, and adding the phase correction T3.

FIG. 5 illustrates a series of operations which may be performed using the system 200 of FIG. 2 in one example embodiment of a method 500 of measuring relative phases of a selected plurality of comb teeth of a comb signal, where the bandwidth of the measurement device is less than the bandwidth of the selected plurality of comb teeth whose relative phases are to be measured.

An operation 510 may include producing a pilot tone 2205 with a signal generator 220.

An operation 520 may include receiving a comb signal 35 having a plurality of comb teeth 110, wherein selected comb teeth among the plurality of comb teeth span a selected bandwidth $S_{BW}$ of comb signal 35.

An operation 530 may include first frequency converter 232 sequentially converting the selected comb teeth 110 to a first intermediate frequency (IF) signal in first IF channel 2325 by mixing comb signal 35 with local oscillator (LO) signal 2155, wherein a frequency of LO signal 2155 is changed for each sequential conversion such that for each frequency of LO signal 2155 at least one of the selected comb teeth 110 is converted to fall within first IF channel 2325.

An operation 540 may include sequentially measuring calibration phases of the converted selected comb teeth 110 in the first IF channel using a first measurement device 242 whose measurement bandwidth for any frequency of LO signal 2155 is less than the selected bandwidth $S_{BW}$ of comb signal 35. Beneficially, thus may include: sampling the IF signal at a sample rate, digitizing the samples of the IF signal, and performing a digital Fourier transform on the digitized samples of the IF signal.

An operation 550 may include mixing pilot tone 2205 with LO signal 2155 to produce a converted pilot tone in second IF channel 2345.

An operation 560 may include, during at least some of the sequential conversions: (1) measuring a first phase of the converted pilot tone with the converted pilot tone at a first frequency in second IF channel 2345 prior to changing the frequency of LO signal 2155; (2) measuring a second phase of the converted pilot tone with the converted pilot tone at a second frequency in second IF channel 2345 subsequent to changing the frequency of LO signal 2155, where the frequency of pilot tone 2205 is maintained to be substantially the same in measuring the first phase of the converted pilot tone as in measuring the second phase of the converted pilot tone, and (3) after measuring the first and second phases of the converted pilot tone, and before changing the frequency of LO signal 2155 again, changing the frequency of pilot tone 2205 such that the converted pilot tone is at the first frequency in second IF channel 2345.

An operation 570 may include processor 250 ascertaining or calculating reference phase differences between the converted selected comb teeth 110 using the measured calibration phases of the selected converted comb teeth 110 and the measured first and second phases of converted pilot tone 2205.

Thus as explained above, embodiments of a system and method may ascertain or determine reference phase differences between selected comb teeth of a comb signal using a receiver or measurement device whose bandwidth is less than the portion of the bandwidth of comb signal the periodically modulated signal. In this manner, a comb signal may be calibrated such that the phase differences between the comb teeth are known, and the comb signal subsequently may be used for measuring one or more characteristics of one or more unknown signals. In that case, these embodiments of methods and systems described above may be considered to comprise calibration methods and systems for a comb signal and associated HPR standard.

In particular, in many situations, it is desired to be able to provide an accurate and complete measurement of one or more periodically modulated signals using a receiver or measurement device whose bandwidth is less than the bandwidth of the periodically modulated signal.

FIGS. 6A-6C illustrate an example of this situation.

FIG. 6A shows an example frequency spectrum 610 of a periodically modulated input signal provided to a device under test (e.g., an amplifier) and an example frequency spectrum 620 of an output signal of the device under test. Here is illustrated an example where the bandwidth of the example frequency spectrum 620 of an output signal of the device under test is somewhat greater than the bandwidth of the spectrum 610 of a periodically modulated input signal, for example due to spectral regrowth in the device under test (e.g., an amplifier operating at least somewhat into compression). Of course it is understood that in general the bandwidth of the frequency spectrum of a periodically modulated input signal provided to a device under test and the bandwidth of the frequency spectrum of an output signal of the device under test may be the same as each other or different from each other.

FIG. 6B shows the example frequency spectrum 612 of the periodically modulated input signal, downconverted to baseband with a first mixing frequency (e.g., LO1), and the example frequency spectrum 622 of the output signal of the device under test, also downconverted to baseband with the first mixing frequency LO1, together with the spectrum of a filter 630 having the limited bandwidth $R_{BW}$ of a receiver which is used to measure and characterize the periodically modulated input signal and the output signal of the device under test. Here it is assumed the bandwidth of the downconverted output signal of the device under test is $S_{BW} > R_{BW}$.

FIG. 6C shows the portion 614 of the spectrum of the periodically modulated input signal and the portion 624 of the spectrum of the output signal of the device under test which are actually able to be measured and characterized by the receiver with the limited bandwidth $R_{BW}$. As denoted in FIG. 6B, a portion 613 of the spectrum of the periodically modulated input signal, and a portion 623 of the spectrum of the output signal of the device under test, are not measured by the receiver because of the limited bandwidth $R_{BW}$.

As noted above, in some cases it is desired to be able to provide an accurate and complete measurement of one or more periodically modulated signals using a receiver whose bandwidth is less than the bandwidth of the periodically modulated signal. As an example, it may be desired to measure the error-vector-magnitude (EVM) of a power amplifier which is excited by a contiguously aggregated 5-carrier LTE-A signal having a bandwidth of 60 MHz using a receiver whose bandwidth $R_{BW}$ is only 40 MHz. Because of spectral regrowth, the total bandwidth of the output signal of the amplifier could easily exceed 300 MHz.

If the output signal was simply downconverted to baseband and then processed by the receiver, the part of the spectrum of the signal which extends beyond the receiver's bandwidth of 40 MHz would be filtered out, and so the signal will not be measured or characterized correctly.

One technique to overcome this problem is spectral stitching. Spectral stitching involves performing multiple, separate, downversions of overlapping portions of the signal's spectrum using different downconversion mixing frequencies, and then stitching together the measurements of all of the overlapping portions in order to produce an overall measurement of the entire spectrum of the signal. The bandwidth of each of the portions is less than or equal to the bandwidth of the measurement receiver. For example, if the bandwidth of the signal's spectrum, $S_{BW}$, is 100 MHz, and the bandwidth of the measurement receiver, $R_{BW}$, is 30 MHz, then at least four separate downconversions for measuring at least four different portions of the signal spectrum are required. These four measurements can then be "spectrally stitched" together to produce a measurement of the entire signal spectrum of 100 MHz. In general, the number, N, of measurements of separate downconverted portions of the signal spectrum which must be performed is:

$$N = \left\lceil \frac{S_{BW}}{R_{BW} - \Delta} \right\rceil, \quad (1)$$

where $\lceil\ \rceil$ is the ceiling function, and wherein $\Delta$ is the minimum amount of overlap required for the adjacent spectral measurements.

FIGS. 7A-7E illustrate an example embodiment of a process of performing multiple, separate, downversions of overlapping portions of an input signal spectrum and an output signal spectrum to measure the input and output signal with a measurement device having a limited bandwidth, that is a bandwidth which is less than the bandwidth of the signal(s) to be measured. In particular, FIGS. 7A-7E illustrate an example embodiment of a process of performing multiple, separate (sequential), downversions of overlapping portions of the example frequency spectrum 602 of a periodically modulated input signal which is supplied or provided to a device under test (DUT) (e.g., an amplifier) and the example frequency spectrum 604 of an output signal of the DUT which were discussed above with respect to FIGS. 6A-6C.

Figure 7A:
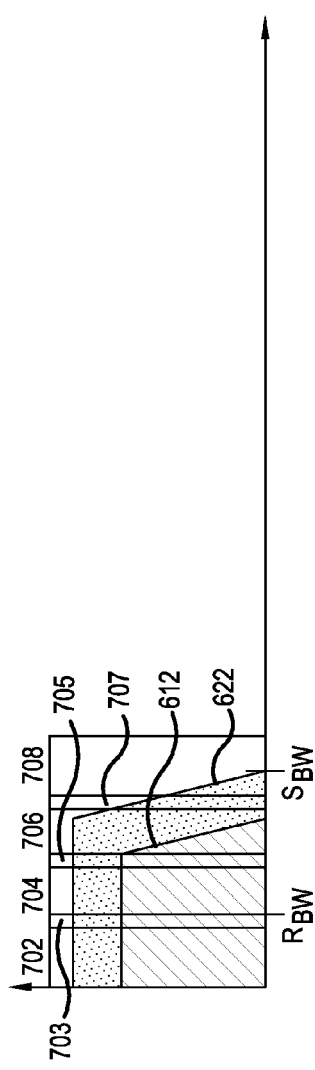

FIG. 7A illustrates the frequency spectrum 612 of a periodically modulated input signal provided to a DUT (e.g., an amplifier), downconverted to baseband with a first mixing frequency (e.g., LO1), and the example frequency spectrum 622 of an output signal of the DUT, also downconverted to baseband with the first mixing frequency LO1, as was shown above in FIG. 6B.

FIG. 7A further illustrates how the downconverted frequency spectrum 622 of the output signal of the DUT can be divided into four overlapping portions or frequency ranges: 702, 704, 706 and 708, which each include an overlap region and which together span the frequency spectrum of the output signal. The overlap regions include: a first overlap region 703 for portions 702 and 704; a second overlap region 705 for portions 704 and 706; and a third overlap region 707 for portions 706 and 708. Of course the downconverted frequency spectrum 612 of the periodically modulated input signal also can be divided into overlapping portions, but for the sake of simplified description, the discussion below follows the downconverted frequency spectrum 622 of the output signal of the DUT.

As described above with respect to FIG. 6C above, when the downconverted frequency spectrum 622 of the output signal of the DUT is provided to a receiver with a limited bandwidth $R_{BW}$, then only the portion 702 is measured by the receiver.

However, as illustrated in FIGS. 7B-E, by repeating the downconversion process with different mixing frequencies, LO2, LO3 and LO4, each of the portions 704, 706 and 708 may be measured separately, and then all of the measured portions 702, 704, 706 and 708 may be stitched together as explained above to reproduce the original output signal frequency spectrum 622.

Figure 7B:
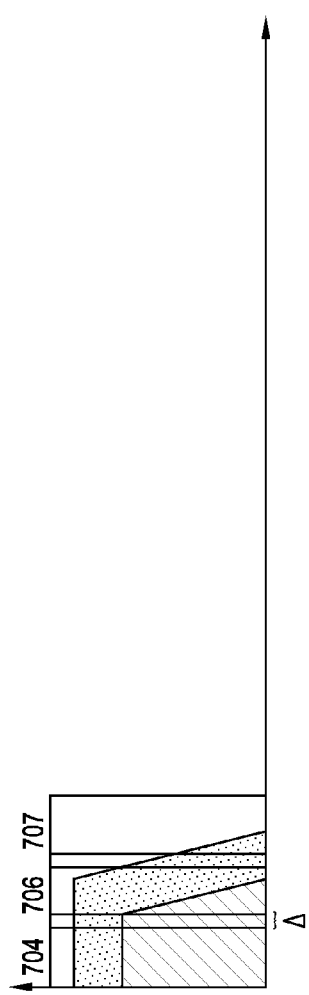

In particular, FIG. 7B illustrates the frequency spectrum 620 of the output signal of the DUT downconverted to baseband with a second mixing frequency (e.g., LO2), where here:

$$|LO2-LO1|=R_{BW}-\Delta \quad (2)$$

Figure 7C:

FIG. 7C then shows the portion 704 of the frequency spectrum 620 of the output signal of the DUT which is actually able to be measured and characterized by the receiver with the limited bandwidth $R_{BW}$.

Similarly, FIG. 7D shows the portion 706 of the frequency spectrum 620 of the output signal of the DUT which is actually able to be measured and characterized by the receiver with the limited bandwidth $R_{BW}$ when the frequency spectrum 620 of the output signal of the DUT is downconverted to baseband with a third mixing frequency (e.g., LO3), where here:

$$|LO3-LO2|=R_{BW}-\Delta \quad (3)$$

Finally, FIG. 7E shows the portion 708 of the frequency spectrum 620 of the output signal of the DUT which is actually able to be measured and characterized by the receiver with the limited bandwidth $R_{BW}$ when the frequency spectrum 620 of the output signal of the DUT is downconverted to baseband with a fourth mixing frequency (e.g., LO4), where here:

$$|LO4-LO3|=R_{BW}-\Delta \qquad (4)$$

As explained above, the frequency spectrum 620 of the output signal of the DUT can be reconstructed by spectrally stitching together the measurements of the overlapping portions 702, 704, 706 and 708.

However, in general there will be unknown phase shifts between the mixing frequencies LO1, LO2, LO3 and LO4 used for the four separate downconversions. In that case, although it is possible to reconstruct the amplitude of the output signal of the DUT as a function of frequency by stitching together the amplitude measurements of the four overlapping portions 702, 704, 706 and 708, reconstructing the phase of the output signal of the DUT as a function of frequency is not possible due to the above-mentioned unknown phase shifts of the LO signal being introduced into the measured phases of the four overlapping portions or frequency ranges 702, 704, 706 and 708. This prevents the measurement of phase-sensitive characteristics such as error-vector-magnitude (EVM).

Accordingly, it would be desirable to provide a system and method of spectral stitching which can further correct for unknown phase shifts between the mixing (LO) frequencies used for the various separate downconversions of the overlapping portions of the spectrum in the spectral stitching process.

In particular, it would be desirable to provide a system and method of spectral stitching which can further correct for unknown phase shifts between the mixing (LO) frequencies used for the various separate downconversions of the overlapping portions of the spectrum in the spectral stitching process by using a comb signal from an HPR standard where the relative phase differences between the comb teeth are known.

Figure 8:
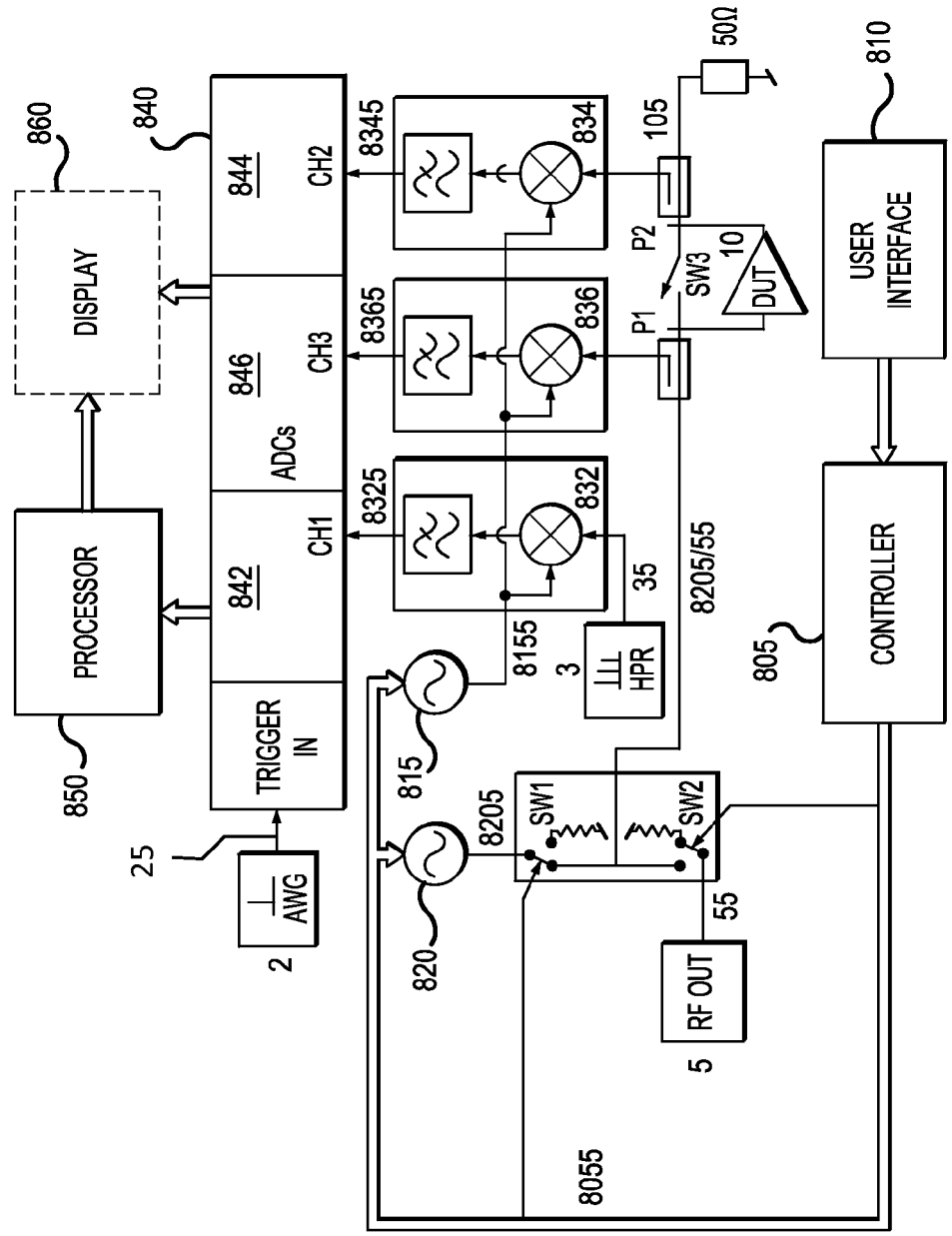
FIG. 8 illustrates an example embodiment of a measurement system for measuring a spectrum of a signal from a device under test, where the bandwidth of a measurement device of the measurement system is less than the bandwidth of the signal to be measured.

FIG. 8 illustrates an example embodiment of a measurement system 800 for measuring at least one characteristic, e.g., a spectrum, of a signal from a device under test, where the bandwidth of a measurement device in measurement system 800 is less than the bandwidth of the signal to be measured. In particular, measurement system 800 is an expansion of measurement system 200 which can measure the relative phase differences between the comb teeth of a comb signal, and then use the known phase relationships between the comb teeth to correct for the unknown phase shifts of the LO signal which are introduced into the measured phases of the overlapping portions or frequency ranges of the output signal of the DUT in the separate or sequential measurement operations wherein the LO frequency is changed.

Measurement system 800 includes: a controller 805; a user interface 810; a local oscillator 815; a signal generator 820 (also referred to as a pilot tone generator); a first frequency converter 832; a second frequency converter 834; a third frequency converter 836; a measurement instrument 840; a processor 850; and a display 860. Measurement system 800 also includes three switches SW1, SW2 and SW3 which may be controlled manually and/or under control of controller 805 to switch operation of measurement system 800 between a calibration phase or mode and a signal measurement phase or mode.

Controller 805 may include one or more processing elements (e.g., CPUs), memory (including volatile and/or nonvolatile memory), and a communication interface for communicating with local oscillator 815 and signal generator 820. The memory may store therein instructions for causing the processor(s) to control operations of system 800, for example to perform various operations and methods described herein such as with respect to FIGS. 9-11 below. In some embodiments, controller 805 may communicate commands to local oscillator 815 and signal generator 820 to set or adjust their output frequencies, amplitudes, etc. via a communication connection or bus 8055. Such communications may employ any of a variety of standard protocols such as General Purpose Interface Bus (GPIB)/IEEE-488, LAN eXtensions for Instrumentation (LXI), VME eXtensions for Instrumentation (VXI), PCI eXtensions for Instrumentation (PXI), universal serial bus (USB), FireWire, Ethernet, TCP/IP, etc.

In some embodiments, user interface 810 allows a user to program and/or set operating parameters for controller 805. For example, where controller 805 executes an algorithm which controls the output frequencies of local oscillator 815 and signal generator 820, in some embodiments a user may enter the frequencies via user interface 810. User interface 810 may include any combination of well known input devices and output devices, such as a keyboard, mouse, trackball, keypad, pushbuttons, one or more display devices (which may include LCD readouts), etc.

In some embodiments, controller 805 and user interface 810 may be integrated into a single device, such as a computer, laptop, tablet, smartphone, etc.

Local oscillator 815 and signal generator 820 may each comprise a programmable frequency generator generating a signal whose frequency is programmable, for example under control of controller 805 and/or via input controls integrated into the device.

Local oscillator 815 generates or produces a local oscillator (LO) signal 8155, and signal generator 820 generates or produces a pilot tone 8205.

First frequency converter 832, second frequency converter 834 (also referred to as a reference or pilot frequency converter), and third frequency converter 836 each include a mixer and a low pass filter (LPF). Each of the mixers has two inputs, including a first input which receives LO signal 8155, and an output. The output of each mixer is connected to an input of the corresponding LPF, and the output of each LPF is at the output of the corresponding frequency converter. Beneficially, the bandwidths of the LPFs in first frequency converter 832, second frequency converter 834, and third frequency converter 836 may all be the same, or approximately the same, as each other.

Second frequency converter 834 is also configured, or connected, to receive an output signal 105 of device under test (DUT) 10 (e.g., an amplifier). More specifically, when measurement system 800 is configured to be in a measurement mode, then output signal 105 is selectively provided to the second input of the mixer of second frequency converter 834 and the mixer is configured to mix output signal 105 with LO signal 8155 to produce an intermediate frequency (IF) signal, also referred to herein as a second IF signal, in a second IF channel 8345 at the output of the mixer. The input of the LPF receives the second IF signal, and the output of the LPF outputs the second IF signal at the output of second frequency converter 834.

Meanwhile, first frequency converter 832 (reference frequency converter) is configured, or connected, to receive comb signal 35. More specifically, comb signal 35 is provided to the second input of the mixer of first frequency converter 832 and the mixer is configured to mix comb signal 35 with LO signal 8155 to produce the first IF signal, in a first IF channel 8325 (also referred to as a reference channel) at the output of the mixer. The input of the LPF receives the first IF signal, and the output of the LPF outputs the first IF signal at the output of first frequency converter 832.

Third frequency converter 836 is configured, or connected, to receive a second signal and to mix the second signal with LO signal 8155 to produce a third intermediate frequency (IF) signal in a third IF channel 8365 at the output of the LPF. In the illustrated embodiment, the second signal is a periodically modulated input signal 55 provided to DUT 10 by a periodic signal generator 5. However in other embodiments, the second signal may a reflected signal produced from the input of DUT 10, or a reflected signal produced from the output of DUT 10. More specifically, in the illustrated embodiment input signal 55 is provided to the second input of the mixer of third frequency converter 836, and the mixer is configured to mix input signal 55 with LO signal 8155 to produce the third IF signal in third IF channel 8365 at the output of the mixer. The input of the LPF receives the third IF signal, and the output of the LPF outputs the third IF signal at the output of third frequency converter 836.

Measurement instrument 840 includes a first measurement device 842, a second measurement device 844 (also referred to as a reference measurement device), and a third measurement device 846.

First measurement device 842, second measurement device 844, and third measurement device 846 may each comprise a sampler, an analog-to-digital converter (ADC) and memory. In some embodiments, memory may be shared among first measurement device 842, second measurement device 844, and third measurement device 846. In particular first measurement device 842 is configured to sample and digitize first IF channel 8325 and produce a plurality of data samples at an operating frequency of the sampler and ADC. Second measurement device 844 is configured to sample and digitize second IF channel 8345 and produce a plurality of data samples at an operating frequency of the sampler and ADC. Third measurement device 846 is configured to sample and digitize third IF channel 8365 and produce a plurality of data samples at an operating frequency of the sampler and ADC. The data samples may be stored in memory for subsequent processing by measurement instrument 840 and/or processor 850. Beneficially, the operating frequencies of all of the samplers/ADCs, and the bandwidths of first measurement device 842, second measurement device 844, and third measurement device 846 may all be the same as each other. Beneficially, the bandwidths of the LPFs in first frequency converter 832, second frequency converter 834, and third frequency converter 836 may be selected to match the operating bandwidths of the ADCs in first measurement device 842, second measurement device 844, and third measurement device 846. In some embodiments, first measurement device 842, second measurement device 844, and third measurement device 846 each may include a digital signal processor which is configured to perform a Fourier transform (e.g., a digital Fourier transform) on data samples output by the ADC.

Processor 850 may include one or more processing elements (e.g., CPUs) and memory, including volatile and/or nonvolatile memory, which may store instructions to be executed by the processing element(s). Processor 850 is configured to process the data samples from first measurement device 842, second measurement device 844, and third measurement device 846 to provide measurements of output signal 105 and the second signal (e.g., input signal 55) provided to third measurement device 846. In some embodiments, processor 850 may include one or more digital signal processors configured to perform a Fourier transform (e.g., a digital Fourier transform) on data samples from each of the first measurement device 842, second measurement device 844, and third measurement device 846. In some embodiments, processor 850 may process the data samples from first measurement device 842 and second measurement device 844 to stitch together phase-adjusted measurements of the first IF signal in first IF channel 8325 to produce a measurement of the amplitude and phase of output signal 105 across the output spectrum as a function of frequency.

In some embodiments, processor 850 and controller 805 may be combined, and may share processing resources, including memory, one or more processors, and/or user interface 810.

Display 860 is configured to display waveforms generated by processor 850 from ADC data produced by measurement instrument 840. In some embodiments, display 860 may be combined with, or part of, user interface 810.

Operations of system 800 for measuring or characterizing one or more signals related to DUT 10 will now be described.

Here it is assumed that the signal bandwidth $S_{BW}$ of output signal 105 is wider than the receiver bandwidth $R_{BW}$ of first measurement device 842, which may be limited by the maximum conversion rate of an ADC which is included in first measurement device 842. Furthermore, it is assumed here that the signal bandwidth $S_{BW}$ of input signal 55 is also wider than the receiver bandwidth $R_{BW}$ of third measurement device 846. It is further assumed that input signal 55 is a periodically modulated signal. It is also assumed that signal generator 5, local oscillator 815, and signal generator 820 are all frequency locked or synchronized to a common master reference frequency (e.g., 10 MHz), for example provided by a master reference frequency generator (not shown in FIG. 8) to which all of these components are connected. Finally, it is assumed that any systematic phase dispersions in IF channels 8325/8345/8365 are corrected for by system 800, for example by means of a system calibration procedure.

In operation, input signal 55 and output signal 105 are each converted to a corresponding IF signal at a lower frequency in a corresponding IF channel 8365/8345 by third and second frequency converters 836 and 836, respectively. In particular, third and second frequency converters 836 and 834 mix input signal 55 and output signal 105, respectively, with LO signal 8155, and then low pass filter the output of the mixer. The IF signals in IF channels 8365 and 8345 are then sampled and digitized by a corresponding pair of ADCs in third and second measurement devices 846 and 844 to produce ADC data. Processor 850 converts the ADC data to frequency domain data by performing a digital Fourier transform (DFT) on the ADC data.

The ADCs in second and third measurement devices 844 and 846 are synchronized with each other, and are further synchronized to the modulation period of input signal 55. One method to realize the synchronization is by using a "marker out" signal output by signal generator 5 and provided to measurement instrument 840, which uses it as a trigger signal for the ADCs. Another method is use of trigger signal 25 output by arbitrary waveform generator 2 with a repetition rate which equals a sub-harmonic of the modulation rate. Other methods can be used to realize the synchronization. Beneficially, each sample made by the samplers and ADCs may be synchronized to occur at a same point in the period of periodic input signal 55 for each measurement of each portion (e.g., 702, 704, 706 and 708) of frequency spectrum 622 of output signal 105.

In order to measure the complete spectra of input signal 55 and output signal 105, the spectra will be divided into two or more overlapping portions or frequency ranges (e.g., 702, 704, 706 and 708) which are each individually measured and then stitched together, as described above.

However it is a challenge, as described above, to reconstruct the phase of input signal 55 and output signal 105 across their bandwidth from the measured phase of each portion of the spectrum. Every one of these measurements of a different portion of the spectrum of output signal 105 or input signal 55 will be made with a different LO frequency, and in general when the LO frequency is changed, an arbitrary and unknown phase shift occurs in LO signal 8155. When the phase measurements of the different portions are stitched together, these phase shifts produce errors in the phase measurement of the overall spectrum unless they are corrected. It should be noted that the same LO signal 8155 is used by both first and third frequency converters 832 and 836.

System 800 addresses this challenge by measuring the phase shifts of LO signal 8155 when the LO frequency is changed from one measurement to the next through the use of first frequency converter 832 (reference frequency converter), second measurement device 844 (reference measurement device), and pilot tone 8205 generated by signal generator 820. System 800 (e.g., by means of processor 850): (1) adjusts the measured phase of the IF signal(s) in IF channels 8325/8365 as a function of frequency for one or more of the sequentially converted portions of the output signal spectrum using by applying to the measured phase a phase offset determined from measured phases of comb teeth 110 of comb signal 35 to account for the change of phase in LO signal 8155 from measurement of one portion (or frequency range) to measurement of a next portion (or frequency range), to thereby produce phase-adjusted measurements of the IF signal; and (2) stitches together the phase-adjusted or phase-corrected measurements of the IF signal(s) to produce a measurement of the amplitude and phase of input signal 55 across the input spectrum, and/or output signal 105 across the output spectrum, as a function of frequency.

A concrete example will now be provided to better illustrate various aspects of embodiments of the systems and methods disclosed herein. In this example, the overall frequency spectrum of the signal being measured is divided into N=4 portions which are measured separately or sequentially, and stitched together to produce an overall spectrum of a signal which is being measured. However it should be understood that in general N may be any integer greater than 1.

Figure 9:
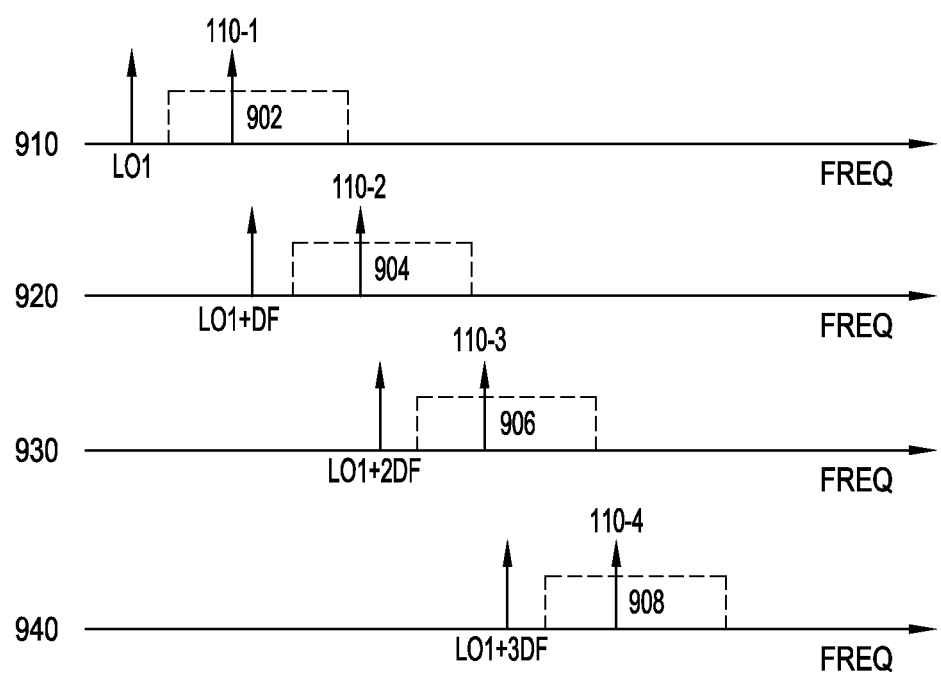
FIG. 9 illustrates an example embodiment of a method of measuring a spectrum of a signal from a device under test, where the bandwidth of the measurement device is less than the bandwidth of the signal to be measured, by stitching together measurements of four overlapping portions of the spectrum.

FIG. 9 illustrates an example embodiment of a method 900 of measuring a spectrum of a signal from a device under test, where the bandwidth of the measurement device is less than the bandwidth of the signal to be measured, by stitching together measurements of four overlapping portions of the spectrum.

In an operation 910, when measuring a first portion of the spectrum (e.g., first portion 702 in FIG. 7A), the LO frequency of LO signal 8155 is set (e.g., by controller 805) to LO1. As a result, the frequency of a first comb tooth 110-1 appears in the first IF channel 8325 (which mirrors second IF channel 8345 and third IF channel 8365). Measurement instrument 840 measures: the first IF signal in first IF channel 8325 representing the downconverted first comb tooth 110-1; the second IF signal in second IF channel 8345 representing the downconverted first portion of output signal 105; and the second IF signal in third IF channel 8365 representing the downconverted first portion of input signal 55. Measurement instrument 840 or processor 850 obtains the amplitude and phase ($PH_I1$) of the downconverted first portion of the spectrum of input signal 55, the amplitude and phase ($PH_O1$) of the downconverted first portion of the spectrum of output signal 105, and the phase (PHC1) of the downconverted first comb tooth 110-1, which may be stored in memory.

Next, in an operation 920, the LO frequency of LO signal 8155 is set (e.g., by controller 805) to LO2=LO1+DF.

Because the frequency of LO signal 8155 is changed in operation 920, downconverted second comb tooth 110-2 now appears in the first IF channel 8325 (which, again, mirrors second IF channel 8345 and third IF channel 8365. Measurement instrument 840 measures: the first IF signal in first IF channel 8325 representing the downconverted second comb tooth 110-2; the second IF signal in third IF channel 8365 representing the downconverted second portion of output signal 105; and the third IF signal in third IF channel 8365 representing the downconverted second portion of input signal 55. Measurement instrument 840 or processor 850 obtains the amplitude and phase ($PH_I2$) of the downconverted second portion of the spectrum of input signal 55, the amplitude and phase ($PH_O2$) of the downconverted second portion of the spectrum of output signal 105, and the phase (PHC2) of the downconverted second comb tooth 110-2. Measurement instrument 840 or processor 850 calculates a first phase correction or fixed phase shift, $\Delta L01$, to be applied to all of the measured spectra, which may be stored in memory. Here, $\Delta L01$=PHC1–PHC2–the first reference phase difference R1 which was earlier determined in a calibration phase or operation of system 800 (see, e.g., methods 300, 400, and 500 discussed above). Measurement instrument 840 or processor 850 calculates the adjusted (or corrected) phase ($C_I2$) of the second portion of the spectrum of input signal 55 to equal $PH_I2+\Delta L01$, and calculates the adjusted (or corrected) phase ($C_O2$) of the second portion of the spectrum of output signal 105 to equal $PH_O2+\Delta L01$. The phase-adjusted data for the second portion of the spectrum of input signal 55 and the phase-adjusted data for the second portion of the spectrum of output signal 105 may be stored in memory.

Next, in an operation 930, the LO frequency of LO signal 8155 is set (e.g., by controller 805) to LO2=LO1+2DF.

Because the frequency of LO signal 8155 is changed in operation 930, downconverted third comb tooth 110-3 now appears in the first IF channel 8325 (which, again, mirrors second IF channel 8345 and third IF channel 8365). Measurement instrument 840 measures: the first IF signal in first IF channel 8325 representing the downconverted third comb tooth 110-3; the second IF signal in third IF channel 8365 representing the downconverted third portion of output signal 105; and the third IF signal in third IF channel 8365 representing the downconverted third portion of input signal 55. Measurement instrument 840 or processor 850 obtains the amplitude and phase ($PH_I3$) of the downconverted third portion of the spectrum of input signal 55, the amplitude and phase ($PH_O3$) of the downconverted third portion of the spectrum of output signal 105, and the phase (PHC3) of the downconverted third comb tooth 110-3. Measurement instrument 840 or processor 850 calculates a second phase correction or fixed phase shift, $\Delta L02$, to be applied to all of the measured spectra, which may be stored in memory. Here, $\Delta L02 = PHC2 - PHC3$ – the second reference phase difference R2 which was earlier determined in the calibration phase or operation of system 800 (see, e.g., methods 300, 400, and 500 discussed above). Measurement instrument 840 or processor 850 calculates the adjusted (or corrected) phase ($C_I3$) of the third portion of the spectrum of input signal 55 to equal $PH_I3 + \Delta L02$, and calculates the adjusted (or corrected) phase ($C_O3$) of the third portion of the spectrum of output signal 105 to equal $PH_O3 + \Delta L02$. The phase-adjusted data for the third portion of the spectrum of input signal 55 and the phase-adjusted data for the third portion of the spectrum of output signal 105 may be stored in memory.

Next, in an operation 940, the LO frequency of LO signal 8155 is set (e.g., by controller 805) to LO2=LO1+3DF.

Because the frequency of LO signal 8155 is changed in operation 930, downconverted fourth comb tooth 110-4 now appears in the first IF channel 8325 (which, again, mirrors second IF channel 8345 and third IF channel 8365). Measurement instrument 840 measures: the first IF signal in first IF channel 8325 representing the downconverted fourth comb tooth 110-4; the second IF signal in third IF channel 8365 representing the downconverted fourth portion of output signal 105; and the third IF signal in third IF channel 8365 representing the downconverted fourth portion of input signal 55. Measurement instrument 840 or processor 850 obtains the amplitude and phase ($PH_I4$) of the downconverted fourth portion of the spectrum of input signal 55, the amplitude and phase ($PH_O4$) of the downconverted fourth portion of the spectrum of output signal 105, and the phase (PHC3) of the downconverted third comb tooth 110-4. Measurement instrument 840 or processor 850 calculates a third phase correction or fixed phase shift, $\Delta L03$, to be applied to all of the measured spectra, which may be stored in memory. Here, $\Delta L03 = PHC3 - PHC4$ – the second reference phase difference R3 which was earlier determined in the calibration phase or operation of system 800 (see, e.g., methods 300, 400, and 500 discussed above). Measurement instrument 840 or processor 850 calculates the adjusted (or corrected) phase ($C_I4$) of the fourth portion of the spectrum of input signal 55 to equal $PH_I3 + \Delta L03$, and calculates the adjusted (or corrected) phase ($C_O4$) of the fourth portion of the spectrum of output signal 105 to equal $PH_O4 + \Delta L03$. The phase-adjusted data for the fourth portion of the spectrum of input signal 55 and the phase-adjusted data for the third portion of the spectrum of output signal 105 may be stored in memory.

In general, this procedure is repeated until all N portions of the spectra of input signal 55 and output signal 105 are measured. The phase-adjusted data for all N portions of the spectrum of input signal 55 are stitched together to produce the input signal spectrum, and the phase-adjusted data for all N portions of the spectrum of output signal 105 are stitched together to produce the output signal spectrum.

Figure 10A:
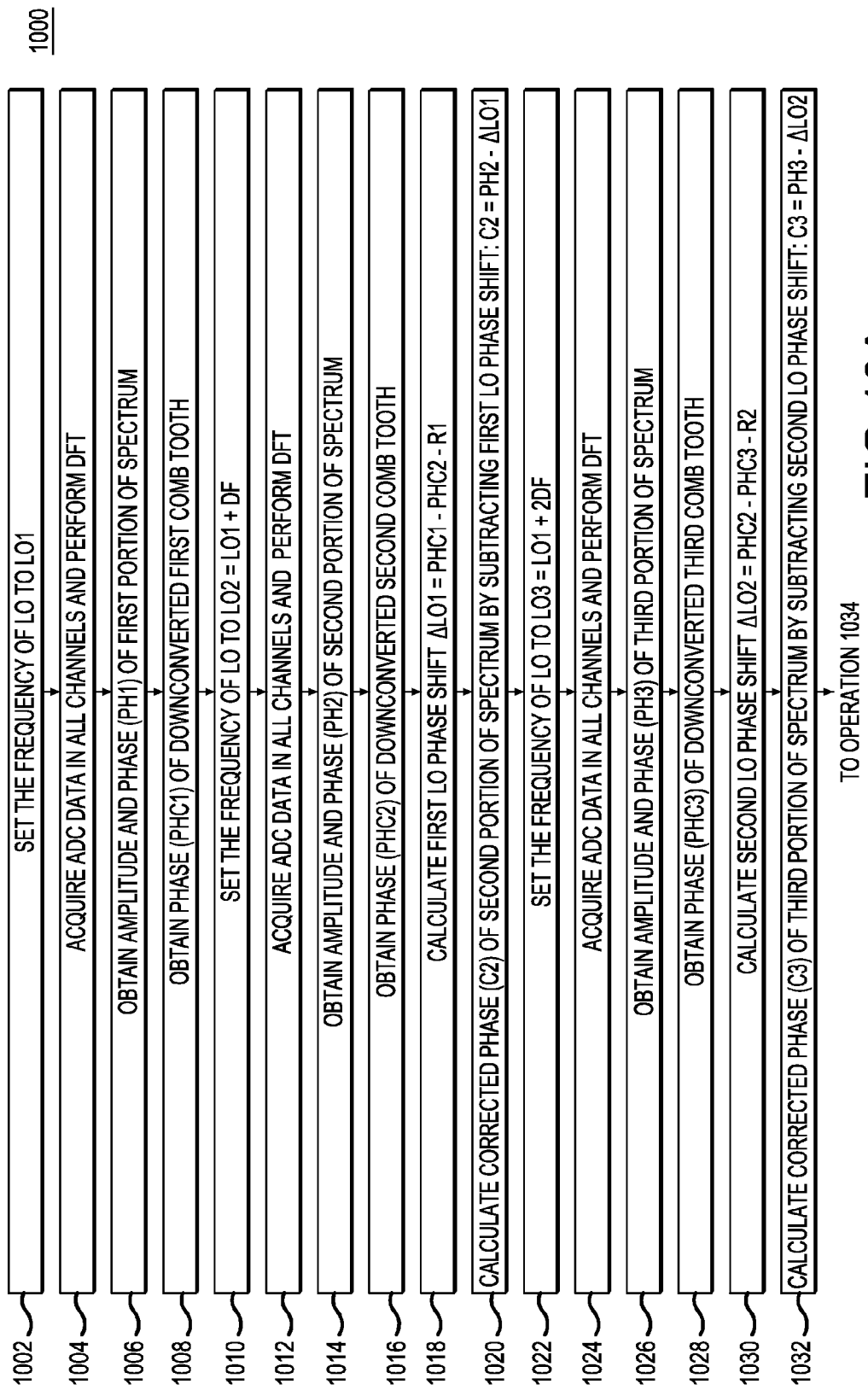
FIGS. 10A and 10B show a flowchart of a method of measuring a spectrum of a signal from a device under test, where the bandwidth of the measurement device is less than the bandwidth of the signal to be measured, by stitching together measurements of four overlapping portions of the spectrum.
Figure 10B:
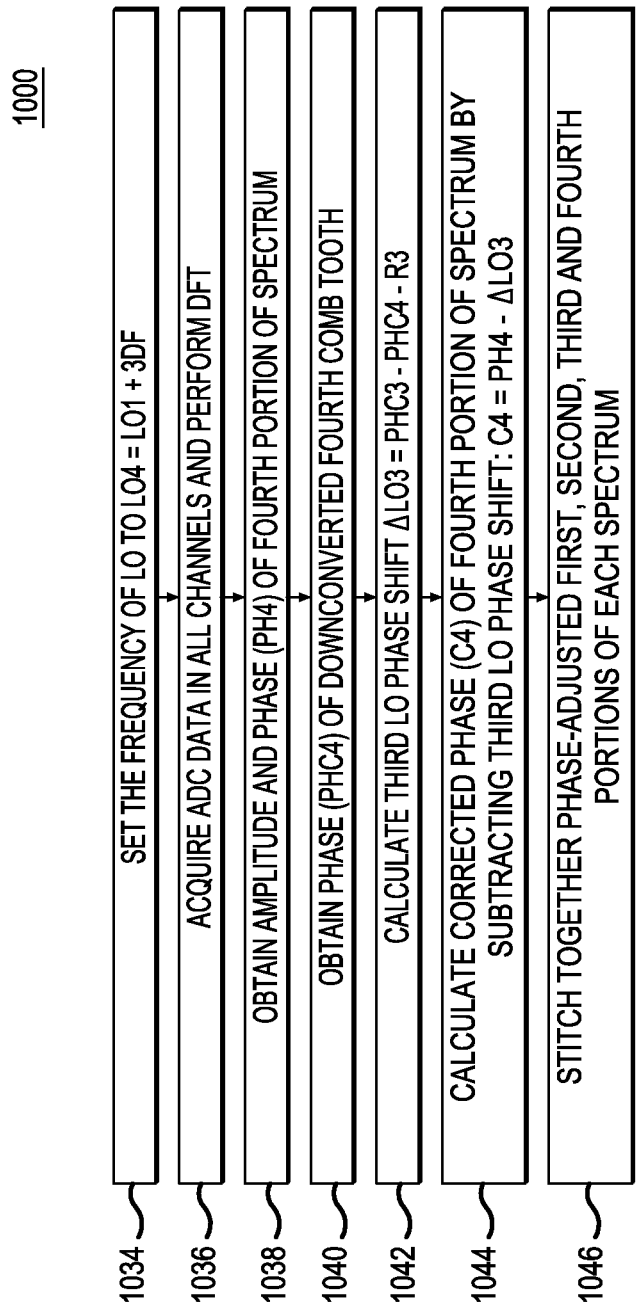

FIGS. 10A and 10B show a flowchart of a method 1000 of measuring a spectrum of a signal from a device under test, where the bandwidth of the measurement device is less than the bandwidth of the signal to be measured, by stitching together measurements of four overlapping portions of the spectrum. In particular, the method 1000 comprises an embodiment of detailed steps for the method 900 shown in FIG. 9.

An operation 1002 includes setting the frequency of LO signal 8155 to LO1. In some embodiments, this operation may be performed by controller 805 sending a command to local oscillator 815 via communication bus 8055.

An operation 1004 includes acquiring ADC data for all IF channels, and performing a digital Fourier transform (DFT) on the ADC data. For example, the ADC data for output signal 105 may be obtained by second measurement device 844 sampling the first IF signal in second IF channel 8325 at a sample rate, and digitizing the samples. In various embodiments, measurement instrument 840 or processor 850 may perform the digital Fourier transform on the digitized samples of the second IF signal (also referred to as digitized IF samples).

An operation 1006 includes obtaining the amplitude and phase of the first portion of the spectrum for each signal being measured. In various embodiments, operation 1006 may be performed by measurement instrument 840 and/or processor 850.

An operation 1008 includes obtaining a phase of the downconverted first comb tooth 110-2. In various embodiments, operation 1008 may be performed by measurement instrument 840 and/or processor 850.

An operation 1010 includes setting the frequency of LO signal 8155 to LO2=LO1+DF. In some embodiments, this operation may be performed by controller 805 sending a command to local oscillator 815 via communication bus 8055.

An operation 1012 includes acquiring ADC data for all IF channels, and performing a digital Fourier transform (DFT) on the ADC data. For example, the ADC data for output signal 105 may be obtained by second measurement device 844 sampling the second IF signal in second IF channel 8345 at a sample rate, and digitizing the sample. In various embodiments, measurement instrument 840 or processor 850 may perform the digital Fourier transform on the digitized samples of the first IF signal (also referred to as digitized IF samples).

An operation 1014 includes obtaining the amplitude and phase of the second portion of the spectrum for each signal being measured. In various embodiments, operation 1014 may be performed by measurement instrument 840 and/or processor 850.

An operation 1016 includes obtaining a phase of the downconverted second comb tooth 110-2. In various embodiments, operation 1016 may be performed by measurement instrument 840 and/or processor 850.

An operation 1018 includes calculating a first LO phase shift $\Delta L01$=measured phase of downconverted first comb tooth 110-1 in operation 1008–measured phase of downconverted second comb tooth 110-2 in operation 1016–the first reference phase difference R1 which was earlier determined in the calibration phase or operation of system 800 (see, e.g., methods 300, 400, and 500 discussed above). In some embodiments, operation 1018 may be performed by measurement instrument 840 and/or processor 850.

An operation 1020 includes calculating an adjusted or corrected phase C2 of the second portion of the spectrum of each signal which is being measured by adding the first LO phase shift $\Delta L01$ to the measured phase PH2 of the second portion of the spectrum of each signal which is being measured. In some embodiments, operation 1018 may be performed by measurement instrument 840 and/or processor 850.

An operation 1022 includes setting the frequency of LO signal 8155 to LO2=LO1+DF. In some embodiments, this operation may be performed by controller 805 sending a command to local oscillator 815 via communication bus 8055.

An operation 1024 includes acquiring ADC data for all IF channels, and performing a digital Fourier transform (DFT)

on the ADC data. For example, the ADC data for output signal 105 may be obtained by second measurement device 844 sampling the second IF signal in second IF channel 8345 at a sample rate, and digitizing the sample. In various embodiments, measurement instrument 840 or processor 850 may perform the digital Fourier transform on the digitized samples of the first IF signal (also referred to as digitized IF samples).

An operation 1026 includes obtaining the amplitude and phase of the third portion of the spectrum for each signal being measured. In various embodiments, operation 1026 may be performed by measurement instrument 840 and/or processor 850.

An operation 1028 includes obtaining a phase of the downconverted third comb tooth 110-3. In various embodiments, operation 1016 may be performed by measurement instrument 840 and/or processor 850.

An operation 1030 includes calculating a second LO phase shift $\Delta L02$=measured phase of downconverted second comb tooth 110-2 in operation 1016−measured phase of downconverted third comb tooth 110-3 in operation 1028− the second reference phase difference R2 which was earlier determined in the calibration phase or operation of system 800 (see, e.g., methods 300, 400, and 500 discussed above). In some embodiments, operation 1030 may be performed by measurement instrument 840 and/or processor 850.

An operation 1032 includes calculating an adjusted or corrected phase C3 of the third portion of the spectrum of each signal which is being measured by adding the second LO phase shift $\Delta L02$ to the measured phase PH3 of the third portion of the spectrum of each signal which is being measured. In some embodiments, operation 1032 may be performed by measurement instrument 840 and/or processor 850.

An operation 1034 includes setting the frequency of pilot tone 8205 to F3=F1+3DF. In some embodiments, this operation may be performed by controller 805 sending a command to signal generator 820 via communication bus 8055.

An operation 1036 includes acquiring ADC data for all IF channels, and performing a digital Fourier transform (DFT) on the ADC data. For example, the ADC data for output signal 105 may be obtained by second measurement device 844 sampling the second IF signal in second IF channel 8345 at a sample rate, and digitizing the sample. In various embodiments, measurement instrument 840 or processor 850 may perform the digital Fourier transform on the digitized samples of the first IF signal (also referred to as digitized IF samples).

An operation 1038 includes obtaining the amplitude and phase of the fourth portion of the spectrum for each signal being measured. In various embodiments, operation 1038 may be performed by measurement instrument 840 and/or processor 850.

An operation 1040 includes obtaining a phase of the downconverted fourth comb tooth 110-4. In various embodiments, operation 1040 may be performed by measurement instrument 840 and/or processor 850.

An operation 1042 includes calculating a third LO phase shift $\Delta L03$=measured phase of downconverted third comb tooth 110-3 in operation 1028−measured phase of downconverted fourth comb tooth 110-4 in operation 1040−the third reference phase difference R3 which was earlier determined in the calibration phase or operation of system 800 (see, e.g., methods 300, 400, and 500 discussed above). In some embodiments, operation 1042 may be performed by measurement instrument 840 and/or processor 850.

An operation 1044 includes calculating an adjusted or corrected phase C4 of the fourth portion of the spectrum of each signal which is being measured by adding the third LO phase shift $\Delta L03$ to the measured phase PH4 of the fourth portion of the spectrum of each signal which is being measured. In some embodiments, operation 1044 may be performed by measurement instrument 840 and/or processor 850.

An operation 1046 includes stitching together the phase-adjusted first, second, third and fourth portions of the spectra as obtained above to reconstruct the overall spectra of each of the signals which is being measured.

Figure 11:
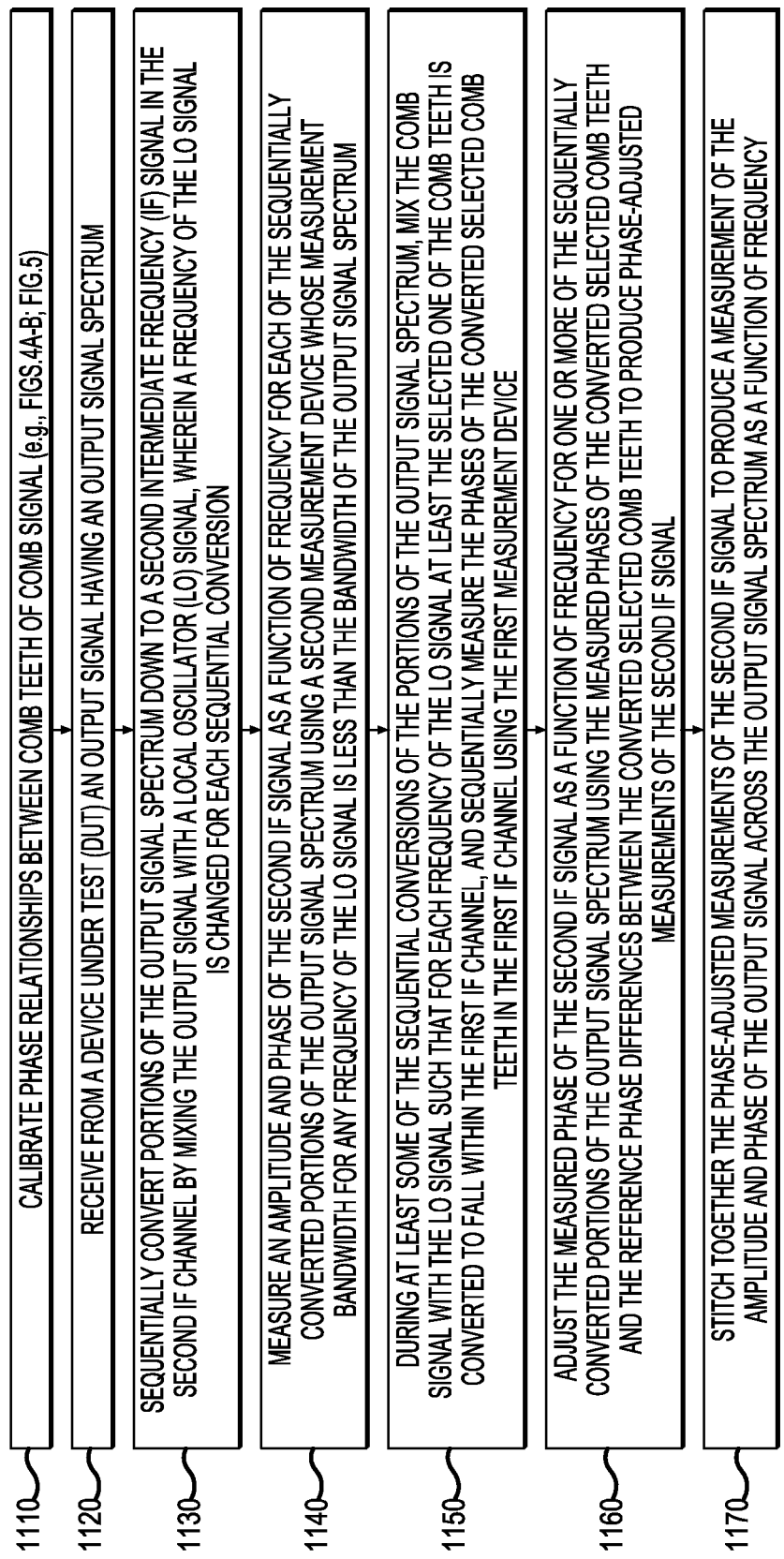
FIG. 11 illustrates a series of operations which may be performed using the measurement system of FIG. 8 in one example embodiment of a method of measuring a spectrum of a signal from a device under test, where the bandwidth of the measurement device is less than the bandwidth of the signal to be measured.

FIG. 11 illustrates a series of operations which may be performed using the system 800 of FIG. 8 in one example embodiment of a method 1100 of measuring a spectrum of a signal from a device under test, where the bandwidth of the measurement device is less than the bandwidth of the signal to be measured.

An operation 1110 may include performing a calibration procedure on comb signal 35 produced by Harmonic Phase Reference (HPR) standard 3 to ascertain or determine phase relationships between comb teeth of comb signal 35. In some embodiments, the calibration procedure may be done while switches SW1 and SW3 are closed and switch SW2 is open in measurement system 800 to thereby connect pilot tone 8205 output by signal generator 820 to the input of second frequency converter 834, to disconnect periodic signal generator 5 and input signal 55 from the input of DUT 10, and to disconnect from DUT 10 from the input of second frequency converter 834. Example embodiments of such a calibration procedure have been described above with respect to FIG. 3, FIGS. 4A-B, and FIG. 5. As noted above, switches SW1, SW2 and SW3 may be operated manually and/or under control of controller 805.

An operation 1120 may include receiving from device under test (DUT) 10 output signal 105 having an output signal spectrum (e.g., frequency spectrum 120). In some embodiments, operation 1120 includes opening switches SW1 and SW3 and closing switch SW2 in measurement system 800 are closed to thereby disconnect pilot tone 8205 output by signal generator 820 from the input of second frequency converter 834, to connect periodic signal generator 5 and input signal 55 to the input of DUT 10, and to connect the output of DUT 10 to the input of second frequency converter 834.

An operation 1130 may include second frequency converter 834 sequentially converting portions (e.g., portions 702, 704, 706 and 708) of the output signal spectrum down to an intermediate frequency (IF) signal in second IF channel 8345 by mixing output signal 105 with local oscillator (LO) signal 8155, wherein a frequency of LO signal 8155 is changed for each sequential conversion. Beneficially, the amount by which the frequency of LO signal 8155 is changed for each sequential conversion is less than the bandwidth(s) of portions 702, 704, 706 and 708 of the output signal spectrum such that a converted overlap region 703, 705 or 707 appears in second IF channel 8345 in each sequential conversion.

An operation 1140 may measure an amplitude and phase of the second IF signal in second IF channel 8345 as a function of frequency for each of the sequentially converted portions of the output signal spectrum using second measurement device 844 whose measurement bandwidth for any fixed frequency of LO signal 8155 is less than the bandwidth of the output signal spectrum. Beneficially, measuring the amplitude and phase of the second IF signal as a function of frequency includes: sampling the IF signal at a sample rate, digitizing the samples of the IF signal, and performing a digital Fourier transform on the digitized samples of the IF signal.

An operation 1150 may include, during at least some of the sequential conversions, mixing comb signal 35 with LO signal 8155 such that for each frequency of LO signal 8155 at least the selected one of the comb teeth 110 is converted to fall within first IF channel 8325, and sequentially measuring the phases of the converted selected comb teeth 110 in first IF channel 8325 using first measurement device 842.

An operation 1160 may include processor 850 adjusting the measured phase of the IF signal as a function of frequency for one or more of the sequentially converted portions of the output signal spectrum using the measured phases of the selected comb teeth 110 and the reference phase differences R1, R2, R3, etc. between the converted selected comb teeth 110 to produce phase-adjusted measurements of the second IF signal.

An operation 1170 may include processor 850 stitching together the phase-adjusted measurements of the second IF signal to produce a measurement of the amplitude and phase of output signal 105 across the output spectrum as a function of frequency.

The method 1100 may include other operations, for example operations related to characterizing a second signal (e.g., input signal 55 in response to which DUT 10 generates output signal 105; a reflected signal produced from the input of the DUT 10; a reflected signal produced from the output of DUT 10; etc.) in addition to output signal 105, for example by performing similar operations to operations for 1120, 1130, 1140, 1160 and 1170, for the second signal.

While example embodiments are disclosed herein, one of ordinary skill in the art appreciates that many variations that are in accordance with the present teachings are possible and remain within the scope of the appended claims. The invention therefore is not to be restricted except within the scope of the appended claims.

The invention claimed is:

1. A method, comprising:
producing a pilot tone with a pilot tone generator;
receiving a comb signal having a plurality of comb teeth, wherein selected comb teeth among the plurality of comb teeth span a selected bandwidth of the comb signal;
sequentially converting the selected comb teeth to a first intermediate frequency (IF) signal in a first IF channel by mixing the comb signal with a local oscillator (LO) signal, wherein a frequency of the LO signal is changed for each sequential conversion such that for each frequency of the LO signal at least one of the selected comb teeth is converted to fall within the first IF channel, and sequentially measuring calibration phases of the converted selected comb teeth in the first IF channel using a first measurement device whose measurement bandwidth for any frequency of the LO signal is less than the selected bandwidth of the comb signal;
mixing the pilot tone with the LO signal to produce a converted pilot tone in a second IF channel,
during at least some of the sequential conversions,
measuring a first phase of the converted pilot tone with the converted pilot tone at a first frequency in the second IF channel prior to changing the frequency of the LO signal,
measuring a second phase of the converted pilot tone with the converted pilot tone at a second frequency in the second IF channel subsequent to changing the frequency of the LO signal, where the frequency of the pilot tone is maintained to be substantially the same in measuring the first phase of the converted pilot tone as in measuring the second phase of the converted pilot tone, and
after measuring the first and second phases of the converted pilot tone, and before changing the frequency of the LO signal again, changing the frequency of the pilot tone such that the converted pilot tone is at the first frequency in the second IF channel; and
ascertaining reference phase differences between the converted selected comb teeth using the measured calibration phases of the converted selected comb teeth and the measured first and second phases of the converted pilot tone.

2. The method of claim 1, wherein a first IF bandwidth of the first IF channel is approximately the same as a second IF bandwidth of the second IF channel.

3. The method of claim 1, wherein an amount by which the frequency of the LO signal is changed for each sequential conversion is about equal to a difference between adjacent comb teeth of the comb signal.

4. The method of claim 1, wherein ascertaining reference phase differences between the converted selected comb teeth using the measured calibration phases of the converted selected comb teeth and the measured first and second phases of the pilot tone comprises:
for at least a current one of the sequential conversions, determining a phase adjustment as a difference between: (1) the first phase of the converted pilot tone with the converted pilot tone at the first frequency, as measured for the current one of the sequential conversions, and (2) the second phase of the converted pilot tone with the converted pilot tone at the second frequency, as measured for an immediately preceding one of the sequential conversions;
ascertaining a measured phase difference between the measured calibration phase of the converted selected comb tooth of the current one of the sequential conversions, and the measured calibration phase of the converted selected comb tooth of the immediately preceding one of the sequential conversions; and
applying the determined phase adjustment to the measured phase difference to obtain the reference phase difference between the converted selected comb tooth of the current one of the sequential conversions and the converted selected comb tooth of the immediately preceding one of the sequential conversions.

5. The method of claim 1, wherein the comb signal is received from a repetitive pulse generator.

6. The method of claim 1, further comprising:
receiving from a device under test (DUT) an output signal having an output signal spectrum;
sequentially converting portions of the output signal spectrum down to a second intermediate frequency (IF) signal in the second IF channel by mixing the output signal with the LO signal, wherein a frequency of the LO signal is changed for each sequential conversion of the portions of the output signal spectrum, and measuring an amplitude and phase of the second IF signal as a function of frequency for each of the sequentially converted portions of the output signal spectrum using a second measurement device whose measurement bandwidth for any frequency of the LO signal is less than a bandwidth of the output signal spectrum;
during at least some of the sequential conversions of the portions of the output signal spectrum, mixing the comb signal with the LO signal such that for each frequency of the LO signal at least the selected one of the comb teeth is converted to fall within the first IF channel, and sequentially measuring the phases of the converted selected comb teeth in the first IF channel using the first measurement device;

adjusting the measured phase of the second IF signal as a function of frequency for one or more of the sequentially converted portions of the output signal spectrum using the measured phases of the converted selected comb teeth and the reference phase differences between the converted selected comb teeth to produce phase-adjusted measurements of the second IF signal; and stitching together the phase-adjusted measurements of the second IF signal to produce a measurement of the amplitude and phase of the output signal across the output signal spectrum as a function of frequency.

7. The method of claim 6, wherein adjusting the measured phase of the second IF signal as a function of frequency for one or more of the sequentially converted portions of the output signal spectrum using the measured phases of the converted selected comb teeth and the reference phase differences between the converted selected comb teeth to produce phase-adjusted measurements of the second IF signal includes:

determining a phase difference between the measured phase of a converted selected comb tooth in the first IF channel in a current one of the sequential conversions of the portions of the output signal spectrum and the measured phase of a converted selected comb tooth in the first IF channel in a preceding one of the sequential conversions of the portions of the output signal spectrum to produce a measured comb tooth phase difference;

adjusting the measured comb tooth phase difference by applying a corresponding one of the reference phase differences to produce a phase adjustment for the second IF signal; and applying the phase adjustment for the second IF signal to the measured phase of the second IF signal as a function of frequency to produce a phase-adjusted measurement of the second IF signal.

8. The method of claim 6, further comprising:
receiving a second signal having a second signal spectrum;

during each sequential conversion of the portions of the second signal spectrum, sequentially converting portions of the second signal spectrum down to a third IF signal in a third IF channel by mixing the second signal with the LO signal, and measuring an amplitude and phase of the third IF signal as a function of frequency for each of the sequentially converted portions of the second signal spectrum using a third measurement device whose measurement bandwidth for any frequency of the LO signal is less than a bandwidth of the second signal spectrum;

adjusting the measured phase of the third IF signal as a function of frequency for one or more of the sequentially converted portions of the second signal spectrum using the measured phases of the converted selected comb teeth and the reference phase differences between the converted selected comb teeth to produce phase-adjusted measurements of the third IF signal; and stitching together the phase-adjusted measurements of the third IF signal to produce a measurement of the amplitude and phase of the second signal across the second signal spectrum as a function of frequency.

9. The method of claim 6, wherein measuring the amplitude and phase of the second IF signal as a function of frequency comprises:

sampling the second IF signal at a sample rate to produce samples of the second IF signal, digitizing the samples of the second IF signal, and performing a digital Fourier transform on the digitized samples of the second IF signal.

10. The method of claim 9, wherein an input signal is supplied to an input of the device under test, and in response to which input signal the device under test generates the output signal as a periodic signal, and wherein each sample is synchronized to occur at a same point in the periodic signal for each measurement of each portion of the output signal spectrum.

11. A system, comprising:
a local oscillator (LO) configured to generate an LO signal having an LO frequency;

a signal generator configured to generate a pilot tone;

a first frequency converter configured to receive a comb signal having a plurality of comb teeth, wherein selected comb teeth among the plurality of comb teeth span a selected bandwidth of the comb signal, and to mix the comb signal with the LO signal to produce a first intermediate frequency (IF) signal in a first IF channel;

a second frequency converter configured to mix the pilot tone with the LO signal to produce converted pilot tone within a second IF channel;

a first measurement device connected to an output of the first frequency converter, the first measurement device having a measurement bandwidth which for any frequency of the LO signal is less than the selected bandwidth of the comb signal;

a second measurement device connected to an output of the second frequency converter;

a controller configured to control the system to:

sequentially convert the selected comb teeth to the first IF signal by controlling the LO to change the LO frequency for each sequential conversion, and measure a calibration phase of each of the converted selected comb teeth with the first measurement device, and during at least some of the sequential conversions:
employ the second measurement device to measure a first phase of the converted pilot tone with the converted pilot tone at a first frequency in the second IF channel prior to changing the frequency of the LO signal, employ the second measurement device to measure a second phase of the converted pilot tone with the converted pilot tone at a second frequency in the second IF channel subsequent to changing the frequency of the LO signal, where the frequency of the pilot tone is maintained to be substantially the same in measuring the first phase of the converted pilot tone as in measuring the second phase of the converted pilot tone, and after measuring the first and second phases of the converted pilot tone, and before changing the frequency of the LO signal again, controlling the signal generator to change the frequency of the pilot tone such that the converted pilot tone is at the first frequency in the second IF channel, wherein the system is configured to ascertain reference phase differences between the converted selected comb teeth using the measured calibration phases of the converted selected comb teeth and the measured first and second phases of the converted pilot tone.

12. The system of claim 11, wherein a first IF bandwidth of the first IF channel is approximately the same as a second IF bandwidth of the second IF channel.

13. The system of claim 11, wherein the controller is configured to change the LO frequency for each sequential conversion is about equal to a difference between adjacent comb teeth of the comb signal.

14. The system of claim 11, wherein the system is configured to ascertain reference phase differences between the converted selected comb teeth using the measured phases of the converted selected comb teeth and the measured first and second phases of the pilot tone by:
for at least a current one of the sequential conversions, determining a phase adjustment as a difference between: (1) the first phase of the converted pilot tone with the converted pilot tone at the first frequency, as measured for the current one of the sequential conversions, and (2) the second phase of the converted pilot tone with the converted pilot tone at the second frequency, as measured for an immediately preceding sequential conversion;
ascertaining a measured phase difference between the measured calibration phase of the converted selected comb tooth of the current one of the sequential conversions, and the measured calibration phase of the converted selected comb tooth of the immediately preceding one of the sequential conversions; and
applying the determined phase adjustment to the measured phase difference to obtain the reference phase difference between the converted selected comb tooth of the current one of the sequential conversions and the converted selected comb tooth of the immediately preceding one of the sequential conversions.

15. The system of claim 11, wherein the first frequency converter comprises:
a first mixer having two inputs connected respectively to an output of a repetitive pulse generator to receive the comb signal and to an output of the LO, and having an output; and
a first low pass filter having an input connected to the output of the first mixer and having an output for outputting the converted selected comb teeth.

16. The system of claim 11, wherein the system is further configured to:
receive from a device under test (DUT) an output signal having an output signal spectrum;
sequentially convert portions of the output signal spectrum down to a second intermediate frequency (IF) signal in the second IF channel by mixing the output signal with the LO signal, wherein a frequency of the LO signal is changed for each sequential conversion of the portions of the output signal spectrum, and measuring an amplitude and phase of the second IF signal as a function of frequency for each of the sequentially converted portions of the output signal spectrum using a second measurement device whose measurement bandwidth for any frequency of the LO signal is less than a bandwidth of the output signal spectrum;
during at least some of the sequential conversions of the portions of the output signal spectrum, mix the comb signal with the LO signal such that for each frequency of the LO signal at least the selected one of the comb teeth is converted to fall within the first IF channel, and sequentially measuring the phases of the converted selected comb teeth in the first IF channel using the first measurement device;
adjust the measured phase of the second IF signal as a function of frequency for one or more of the sequentially converted portions of the output signal spectrum using the measured phases of the converted selected comb teeth and the reference phase differences between the converted selected comb teeth to produce phase-adjusted measurements of the second IF signal; and
stitch together the phase-adjusted measurements of the second IF signal to produce a measurement of the amplitude and phase of the output signal across the output signal spectrum as a function of frequency.

17. The system of claim 16, wherein the first measurement device comprises:
a sampler connected to the output of the second frequency converter and configured to sample the second IF signal to produce samples of the second IF signal;
an analog-to-digital converter configured to digitize the samples of the second IF signal; and
a digital signal processor configured to perform a digital Fourier transform on the digitized samples of the second IF signal and configured to determine the amplitude and phase of the second IF signal as a function of frequency.

18. The system of claim 16, further comprising:
a third frequency converter configured to mix a second signal to a second IF signal in a third IF channel; and
a third measurement device connected to an output of the third frequency converter and configured to measure an amplitude and phase of the second IF signal as a function of frequency for each of the sequential conversions, wherein the third measurement device has a measurement bandwidth which for any frequency of the LO signal is less than a bandwidth of the second signal spectrum, and
wherein the second signal is one of: an input signal which is also supplied to an input of the device under test, and in response to which input signal the device under test generates the output signal; a reflected signal produced from the input of the device under test; and a reflected signal produced from the output of the device under test.

19. A method, comprising:
receiving at an input of a measurement system a comb signal having a plurality of comb teeth, wherein selected comb teeth among the plurality of comb teeth span a selected bandwidth of the comb signal;
the measurement system sequentially measuring calibration phases of the selected comb teeth using a local oscillator (LO) signal output by a programmable frequency generator, the LO signal having a frequency and phase which are changed for each sequential measurement; and
adjusting the measured calibration phases of the selected comb teeth to account for the change of phase in the LO signal from measurement of one selected comb tooth to measurement of a next selected comb tooth to ascertain reference phase differences between the selected comb teeth,
wherein adjusting the measured calibration phases of the selected comb teeth to account for the change of phase in the LO signal from measurement of the one selected comb tooth to measurement of the next selected comb tooth includes the measurement system measuring a first phase and a second phase of a pilot tone using the LO signal output by the programmable frequency generator, respectively, before and after the frequency and phase of the LO signal changes from measurement of the one comb tooth to measurement of the next comb tooth, and applying to the measured calibration phases of the selected comb teeth the measured first and second phases of the pilot tone, and wherein the frequency of the pilot tone is maintained to be substantially the same in measuring the first phase of the pilot tone as in measuring the second phase of the pilot tone.

20. The method of claim 19, further comprising:

receiving at a second input of the measurement system from a device under test (DUT) an output signal having an output signal spectrum, the output signal spectrum comprising at least two frequency ranges which together span the output signal spectrum;

the measurement system sequentially measuring an amplitude and a phase of the output signal as a function of frequency in each of the frequency ranges using the LO signal output by the programmable frequency generator, whose frequency and phase are changed for each sequential measurement;

adjusting a measured phase of the output signal as a function of frequency for at least one of the frequency ranges to account for the change of phase in the LO signal from measurement of one frequency range to measurement of a next frequency range to produce phase-adjusted measurements of the output signal; and stitching together the phase-adjusted measurements of the output signal as a function of frequency in each of the frequency ranges to produce a measurement of the amplitude and phase of the output signal as a function of frequency across the output signal spectrum, wherein adjusting the measured phase of the output signal as a function of frequency in each of the frequency ranges includes applying to the measured phase of the output signal as a function of frequency in each of the frequency ranges includes applying a phase offset determined from phases of the converted selected comb teeth measured during each sequential measurement of the amplitude and phase of the output signal as a function of frequency in each of the frequency ranges, and the reference phase differences between the converted selected comb teeth.

* * * * *